United States Patent
Nomura et al.

(10) Patent No.: US 9,685,542 B2
(45) Date of Patent: *Jun. 20, 2017

(54) ATOMIC LAYER DEPOSITION OF P-TYPE OXIDE SEMICONDUCTOR THIN FILMS

(71) Applicant: SnapTrack, Inc., San Diego, CA (US)

(72) Inventors: Kenji Nomura, San Jose, CA (US); John Hyunchul Hong, San Clemente, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/586,282

(22) Filed: Dec. 30, 2014

(65) Prior Publication Data

US 2016/0190290 A1    Jun. 30, 2016

(51) Int. Cl.
| | |
|---|---|
| H01L 29/66 | (2006.01) |
| H01L 29/786 | (2006.01) |
| H01L 27/12 | (2006.01) |
| H01L 21/02 | (2006.01) |

(Continued)

(52) U.S. Cl.
CPC .. *H01L 29/66969* (2013.01); *C23C 16/45531* (2013.01); *H01L 21/0262* (2013.01); *H01L 21/02422* (2013.01); *H01L 21/02535* (2013.01); *H01L 21/02565* (2013.01); *H01L 27/1225* (2013.01); *H01L 29/7869* (2013.01); *C23C 16/407* (2013.01); *C23C 16/45534* (2013.01)

(58) Field of Classification Search
CPC ........... H01L 2/023841; H01L 2/02452; H01L 2/02535; H01L 21/023841; H01L 21/02452; H01L 21/02535
See application file for complete search history.

(56) References Cited

U.S. PATENT DOCUMENTS

| | | |
|---|---|---|
| 5,504,020 A | 4/1996 | Aomori et al. |
| 7,189,992 B2 | 3/2007 | Wager et al. |
| 7,297,977 B2 | 11/2007 | Hoffman et al. |

(Continued)

FOREIGN PATENT DOCUMENTS

| | | |
|---|---|---|
| JP | 2000277743 A | 10/2000 |
| JP | 2004241504 A | 8/2004 |
| JP | 2012089878 A | 5/2012 |

OTHER PUBLICATIONS

Han, J H, et al. Growth of p-type tin(II) monoxide thin films by atomic layer deposition from bis(1-dimethylamino-2-methyl-2propoxy)tin and H2O. Chem. Mater., 26 (2014) 6088-6091.*

(Continued)

*Primary Examiner* — Thao X Le
*Assistant Examiner* — Gardner W Swan
(74) *Attorney, Agent, or Firm* — Weaver Austin Villeneuve & Sampson LLP-QUAL

(57) ABSTRACT

Provided herein are methods of depositing p-type metal oxide thin films by atomic layer deposition (ALD). Also provided are p-type metal oxide thin films and TFTs including p-type metal oxide channels. In some implementations, the p-type metal oxide thin films have a metal and oxygen vacancy defect density of less than $10^{19}/cm^3$. The p-type metal oxide thin films may be electrically active throughout the entire thicknesses of the thin films.

20 Claims, 10 Drawing Sheets

(51) Int. Cl.
C23C 16/455 (2006.01)
C23C 16/40 (2006.01)

(56) References Cited

U.S. PATENT DOCUMENTS

| | | | |
|---|---|---|---|
| 7,372,114 B2 | 5/2008 | Sakama et al. | |
| 7,462,862 B2 | 12/2008 | Hoffman et al. | |
| 7,564,055 B2 | 7/2009 | Hoffman | |
| 7,838,348 B2 | 11/2010 | Hoffman et al. | |
| 8,653,516 B1 | 2/2014 | Nelson et al. | |
| 8,748,222 B2 | 6/2014 | Shinn et al. | |
| 8,890,150 B2 | 11/2014 | Sasaki et al. | |
| 2005/0133917 A1 | 6/2005 | Hoffman et al. | |
| 2007/0069209 A1 | 3/2007 | Jeong et al. | |
| 2008/0090341 A1 | 4/2008 | Tanaka et al. | |
| 2008/0224133 A1 | 9/2008 | Park et al. | |
| 2010/0140609 A1 | 6/2010 | Yano et al. | |
| 2011/0089444 A1* | 4/2011 | Yao | F21K 9/00 257/93 |
| 2011/0097492 A1 | 4/2011 | Kerr et al. | |
| 2011/0253997 A1 | 10/2011 | Park et al. | |
| 2011/0309356 A1 | 12/2011 | Yabuta et al. | |
| 2012/0282733 A1* | 11/2012 | Lee | H01L 21/428 438/104 |
| 2013/0075740 A1 | 3/2013 | Correia Fortunato et al. | |
| 2013/0217180 A1 | 8/2013 | Facchetti et al. | |
| 2013/0241881 A1 | 9/2013 | Jeon et al. | |
| 2013/0280859 A1 | 10/2013 | Kim et al. | |
| 2013/0292668 A1 | 11/2013 | Oh et al. | |
| 2014/0077206 A1* | 3/2014 | Sunamura | H01L 29/242 257/43 |
| 2014/0159035 A1 | 6/2014 | Park et al. | |
| 2014/0183525 A1* | 7/2014 | Kaneko | H01L 29/7869 257/43 |
| 2014/0217396 A1 | 8/2014 | Imamura et al. | |
| 2014/0353648 A1 | 12/2014 | Abe et al. | |
| 2015/0162191 A1 | 6/2015 | Saly et al. | |
| 2016/0133751 A1 | 5/2016 | Nomura | |
| 2016/0218223 A1* | 7/2016 | Nomura | H01L 29/66969 |

OTHER PUBLICATIONS

Bachmann, J, et al. Stoichiometry of nickel oxide films prepared by ALD. Chem. Vap. Deposition, 17 (2011) 177-180.*
Reiners, M, et al. Growth and crystallization of TiO2 thin films by atomic layer deposition using a novel amido guanidinate titanium source and tetrakis-dimethylamido-titanium. Chem. Mater., 25 (2013) 2934-2943.*
Hsu, P C, et al. Sputtering deposition of p-type SnO films with SnO2 target in hydrogen-containing atmosphere. Appl. Mater. Interfaces, 6, 2014, 13724-13729.*
Song et al., "*Effect of Post-Deposition Treatment on Characteristics of P-channel SnO Thin-Film Transistors*", International Journal of Digital Content Technology and its Applications (JDCTA), vol. 7, No. 12, Aug. 2013, 6 pages.
Ozmen B., "*Solution Deposition and Characterization of the Thin Film Inorganic Materials*", An Abstract of the Thesis, Bahar Ozmen for the degree of Master of Science in Chemistry presented on Jul. 16, 2007, 66 pages.
Lee, Ho-Nyeon, et al. "p-Channel Tin Monoxide Thin Film Transistor Fabricated by Vacuum Thermal Evaporation," Jpn. J. Appl. Phys., 49, Issue 2R., 2010, pp. 020202-1-020202-3.
Hsu P.C., et al., "Fabrication of p-Type SnO Thin-Film Transistors by Sputtering with Practical Metal Electrodes," Japanese Journal of Applied Physics, 2013, vol. 52, pp. 05DC07-1-05DC07-6.

Shin Y.H. et al., Hydrogenation and Annealing Effects inn-Type ZnO Bulk Samples, Journal of the Korean Physical Society, vol. 53, No. 5, Nov. 2008, pp. 2504-2507.
International Search Report and Written Opinion—PCT/US2015/064130—ISA/EPO—Mar. 2, 2016.
Jeffrey E., et al., "Atomic Layer Deposition of Tin Oxide Films using tetrakis(dimethylamino) tin," Journal of Vacuum Science and Technology: Part at AVS /AIP, Melville, NY, US, Jan. 29, 2008 (Jan. 29, 2008), vol. 26, No. 2, pp. 244-252, XP012113850, ISSN: 0734-2101, DOI: 10.1116/1.2835087.
Kook L.B., et al., "Physical/chemical Properties of Tin Oxide Thin Film Transistors Prepared using Plasma-enhanced Atomic Layer Deposition,"Materials Research Bulletin, Apr. 26, 2012 (Apr. 26, 2012), vol. 47, No. 10, pp. 3052-3055, XP028937675, ISSN: 0025-5408, DOI: 10.1016/J.MATERRESBULL.2012.04.120 p. 3052.
Sathees K.S., et al., "Growth Behavior and Properties of Atomic Layer Deposited Tin Oxide on Silicon from Novel Tin(II)acetylacetonate Precursor and Ozone," Journal of Vacuum Science and Technology: Part A, AVS /AIP, Melville, NY, US, Dec. 4, 2013 (Dec. 4, 2013), vol. 32, No. 1, 01A112, pp. 1-6, XP012179046, ISSN: 0734-2101, DOI: 10.1116/1.4837915 [retrieved on Jan. 1, 1901].
International Search Report and Written Opinion—PCT/US2015/051921—ISA/EPO—Dec. 11, 2015.
Janotti A. "Defects and Doping in Oxides: What we Have Learned So Far," Materials UCanta Barbara, Sold State Lighting and Energy Center, Feb. 23, 2010, 39 pages.
Jessen G., "Study on the Hydrogenated ZnO-based Thin Film Transistors," Final Report, School of Information and Communications, Gwangju Institute of Science and Technology, Apr. 30, 2011, pp. 1-16.
Miyase T., "Roles of Hydrogen in Amorphous Oxide Semiconductor In—Ga—Zn-0: Comparison of Conventional and Ultra-High-Vacuum Sputtering," ECS Journal of Solid State Science and Technology, 2014, vol. 3, Issue. 9, 03085-03090, 9 pages.
Oh S-l., et al., "Hydrogenated IGZO Thin-Film Transistors Using High-Pressure Hydrogen Annealing", IEEE Transactions on Electron Devices, vol. 60, No. 8, Aug. 2013, pp. 2537-2541.
Parks., "Synthesis and Study of Oxides and Chalcogenides: Thin Films and Crystals," An Abstract of the Thesis of Sang moon Park, Doctor of Philosophy in Chemistry, presented on Jul. 22, 2002, 223 pages.
Remashan K. et al., "Impact of Hydrogenation of ZnO TFTs by Plasma-Deposited Silicon Nitride Gate Dielectric," IEEE Transactions on Electron Devices, vol. 55, No. 10, Oct. 2008, pp. 2736-2743.
Remashan K., et al., "Performance Enhancement of Bottom-gate ZnO TFTs by Hydrogenation Using Silicon Nitride Gate Insulator," downloaded from internet Jan. 2015, 1 page, undated, downloaded at https://www.google.com/?gwsrd=ssl#q=Performance+Enhancement+of+Bottom-gate+ZnO+TFTs+by+Hydrogenation.
Varley A. et al.,"Ambipolar Doping in SnO," Appl. Phys. Lett., 103, 2013, pp. 082118-1-082118-4.
Batzill M., et al., "The Surface and Materials Science of Tin Oxide", Progress in Surface Science, Elsevier, vol. 79, Issues 2-4, 2005, pp. 47-154.
International Search Report and Written Opinion—PCT/US2015/064131—ISA/EPO—Feb. 24, 2016.
Lee C-H., et al., "P-type Mn-doped SnO2 oxide Semiconductor materials prepared by a Sol-gel method", The Korean Ceramic Society, 2011, 1 page.
Office Action dated Jun. 30, 2016, issued in U.S. Appl. No. 14/603,186.
Final Office Action dated Oct. 28, 2016, issued in U.S. Appl. No. 14/603,186.

* cited by examiner

ATOMIC LAYER DEPOSITION OF P-TYPE OXIDE SEMICONDUCTOR THIN FILMS

TECHNICAL FIELD

This disclosure relates to thin film transistors and more particularly to p-channel metal oxide thin film transistors and fabrication techniques.

DESCRIPTION OF THE RELATED TECHNOLOGY

Electromechanical systems (EMS) include devices having electrical and mechanical elements, actuators, transducers, sensors, optical components such as mirrors and optical films, and electronics. EMS devices or elements can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers, or that add layers to form electrical and electromechanical devices.

One type of EMS device is called an interferometric modulator (IMOD). The term IMOD or interferometric light modulator refers to a device that selectively absorbs and/or reflects light using the principles of optical interference. In some implementations, an IMOD display element may include a pair of conductive plates, one or both of which may be transparent and/or reflective, wholly or in part, and capable of relative motion upon application of an appropriate electrical signal. For example, one plate may include a stationary layer deposited over, on or supported by a substrate and the other plate may include a reflective membrane separated from the stationary layer by an air gap. The position of one plate in relation to another can change the optical interference of light incident on the IMOD display element. IMOD-based display devices have a wide range of applications, and are anticipated to be used in improving existing products and creating new products, especially those with display capabilities.

Hardware and data processing apparatus may be associated with electromechanical systems. Such hardware and data processing apparatus may include thin film transistors (TFTs). A TFT is a field-effect transistor that includes thin films of metal and semiconductor layers.

SUMMARY

The systems, methods and devices of this disclosure each have several innovative aspects, no single one of which is solely responsible for the desirable attributes disclosed herein.

One innovative aspect of the subject matter described in this disclosure can be implemented in a method of forming a thin film transistor (TFT). The method may include providing a substrate, exposing the substrate to a pulse of a metal reactant to form an adsorbed layer of the metal reactant over the substrate; and exposing the substrate to a pulse of an oxidant to react with the adsorbed layer of the metal reactant and form a metal oxide layer where the metal oxide layer is a tin-based (Sn-based) p-type semiconductor layer.

In some implementations, the metal reactant is a Sn (II)-based organometallic reactant. Examples of oxidants include oxygen ($O_2$), ozone ($O_3$), water ($H_2O$), hydrogen peroxide ($H_2O_2$) and combinations thereof. In some implementations, the oxidant is a hydrogen-containing oxidant. Hydrogen from a hydrogen-containing oxidant may be incorporated in the metal oxide layer. In some implementations, the oxidant is a relatively weak oxidant, with examples including $H_2O$, carbon dioxide ($CO_2$), carbon monoxide (CO), methanol ($CH_3OH$), ethanol ($C_2H_6OH$), isopropyl alcohol ($C_3H_7OH$), and combinations thereof. In some implementations, exposing the substrate to a pulse of an oxidant includes applying plasma energy.

In some implementations, substrate is exposed to a second metal reactant. The Sn-based p-type semiconductor layer may be, for example, a ternary Sn-based metal oxide layer. Examples of second metal reactants include tungsten-containing reactants, titanium-containing reactants, niobium-containing reactants, and boron-containing reactants. In some implementations, the substrate is exposed to a dopant pulse. In one example, a dopant can be hydrogen. The method may further include forming a gate electrode and a gate dielectric, wherein the gate dielectric is between the p-type metal oxide semiconductor layer and the gate electrode. The gate electrode may be formed over the metal oxide layer in some implementations. The metal oxide layer may be formed over the gate electrode in some implementations.

Another innovative aspect of the subject matter described in this disclosure can be implemented in an apparatus including a TFT. The TFT includes a source electrode; a drain electrode; and a semiconductor channel connecting the source electrode and the drain electrode, the semiconductor channel including a Sn-based p-type metal oxide semiconductor, wherein the Sn-based p-type metal oxide semiconductor has a vacancy defect density of less than about $10^{19}/cm^3$. In some implementations, the thickness of the semiconductor channel is less than about 15 nm. In some implementations, the semiconductor channel is electrically active throughout its thickness. In some implementations, the Sn-based p-type metal oxide semiconductor may be an ALD-deposited layer.

The TFT can be part of a complementary metal-oxide-semiconductor (CMOS) TFT device in some implementations. According to various implementations, the TFT may be a top gate or a bottom gate TFT. The apparatus may further include a display; a processor that is configured to communicate with the display, the processor being configured to process image data; and a memory device that is configured to communicate with the processor. The apparatus may further include a driver circuit configured to send at least one signal to the display; and a controller configured to send at least a portion of the image data to the driver circuit. In some implementations, a driver circuit includes the TFT. The apparatus may further include an image source module configured to send the image data to the processor, wherein the image source module includes at least one of a receiver, transceiver, and transmitter. In some implementations, the apparatus includes an input device configured to receive input data and to communicate the input data to the processor.

Details of one or more implementations of the subject matter described in this disclosure are set forth in the accompanying drawings and the description below.

Although the examples provided in this disclosure are primarily described in terms of EMS and MEMS-based displays the concepts provided herein may apply to other types of displays such as liquid crystal displays, organic light-emitting diode ("OLED") displays, and field emission displays. Other features, aspects, and advantages will become apparent from the description, the drawings and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION

Figure 1:
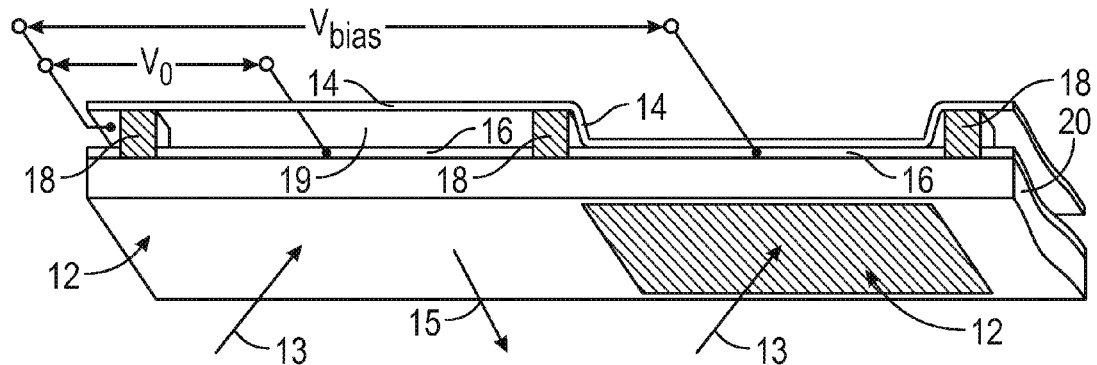
FIG. 1 is an isometric view illustration depicting two adjacent interferometric modulator (IMOD) display elements in a series or array of display elements of an IMOD display device.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that can be configured to display an image, whether in motion (such as video) or stationary (such as still images), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (e.g., e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

Implementations described herein relate to p-type metal oxide semiconductor thin films and methods of fabrication. The methods of fabrication involve atomic layer deposition (ALD) techniques of depositing metal oxide films under conditions such that the metal oxide thin films are p-type semiconductor thin films. In some implementations, p-type tin-based (Sn-based) metal oxide thin films are fabricated by exposing a substrate to alternating pulses of one or more metal reactants and an oxidant. One of the metal reactants may be a tin (II)-containing reactant. In some implementations, temperature is controlled to deposit a p-type semiconductor thin film, rather than depositing an n-type semiconductor film or an insulator. In some implementations, for tin (II)-based thin films, temperatures below about 300° C. may be used.

Implementations described herein relate to ALD-deposited p-type metal oxide films that have low defect densities. In some implementations, the ALD-deposited p-type metal oxide films have a metal and oxygen vacancy defect density of less than $10^{19}/cm^3$. The ALD-deposited p-type metal oxide thin films may be electrically active throughout the entire thicknesses of the thin films. Implementations described herein relate to p-type thin film transistors (TFTs) having p-type channels that include ALD-deposited p-type metal oxide films. In some implementations, p-type TFTs described herein may be used in complementary metal-oxide-semiconductor (CMOS) TFT devices, which include n-type TFTs and p-type TFTs.

Particular implementations of the subject matter described in this disclosure can be implemented to realize one or more of the following potential advantages. A p-type metal oxide semiconductor thin film having precisely controlled stoichiometry can be fabricated by the ALD methods described herein. An ALD-deposited p-type metal oxide semiconductor thin film can be implemented in a p-type thin film transistor (TFT) channel layer that is electrically active throughout the entire thickness of the layer with no incubation layer. A p-type TFT including an ALD-deposited p-type metal oxide semiconductor may be implemented in a CMOS TFT circuit. Such TFT circuits may be integrated on a display backplate, for example as driver circuits, or in other electronic devices. This reduces manufacturing cost and failures associated with separately packaged integrated circuit (IC) drivers.

An example of a suitable EMS or MEMS device or apparatus, to which the described implementations of the TFT may apply, is a reflective display device. Reflective display devices can incorporate interferometric modulator (IMOD) display elements that can be implemented to selectively absorb and/or reflect light incident thereon using principles of optical interference. IMOD display elements can include a partial optical absorber, a reflector that is movable with respect to the absorber, and an optical resonant cavity defined between the absorber and the reflector. In some implementations, the reflector can be moved to two or more different positions, which can change the size of the optical resonant cavity and thereby affect the reflectance of the IMOD. The reflectance spectra of IMOD display elements can create fairly broad spectral bands that can be shifted across the visible wavelengths to generate different colors. The position of the spectral band can be adjusted by changing the thickness of the optical resonant cavity. One way of changing the optical resonant cavity is by changing the position of the reflector with respect to the absorber.

FIG. 1 is an isometric view illustration depicting two adjacent interferometric modulator (IMOD) display elements in a series or array of display elements of an IMOD display device. The IMOD display device includes one or more interferometric EMS, such as MEMS, display elements. In these devices, the interferometric MEMS display elements can be configured in either a bright or dark state. In the bright ("relaxed," "open" or "on," etc.) state, the display element reflects a large portion of incident visible light. Conversely, in the dark ("actuated," "closed" or "off," etc.) state, the display element reflects little incident visible light. MEMS display elements can be configured to reflect predominantly at particular wavelengths of light allowing for a color display in addition to black and white. In some implementations, by using multiple display elements, different intensities of color primaries and shades of gray can be achieved.

The IMOD display device can include an array of IMOD display elements which may be arranged in rows and columns. Each display element in the array can include at least a pair of reflective and semi-reflective layers, such as a movable reflective layer (i.e., a movable layer, also referred to as a mechanical layer) and a fixed partially reflective layer (i.e., a stationary layer), positioned at a variable and controllable distance from each other to form an air gap (also referred to as an optical gap, cavity or optical resonant cavity). The movable reflective layer may be moved between at least two positions. For example, in a first position, i.e., a relaxed position, the movable reflective layer can be positioned at a distance from the fixed partially reflective layer. In a second position, i.e., an actuated position, the movable reflective layer can be positioned more closely to the partially reflective layer. Incident light that reflects from the two layers can interfere constructively and/or destructively depending on the position of the movable reflective layer and the wavelength(s) of the incident light, producing either an overall reflective or non-reflective state for each display element. In some implementations, the display element may be in a reflective state when unactuated, reflecting light within the visible spectrum, and may be in a dark state when actuated, absorbing and/or destructively interfering light within the visible range. In some other implementations, however, an IMOD display element may be in a dark state when unactuated, and in a reflective state when actuated. In some implementations, the introduction of an applied voltage can drive the display elements to change states. In some other implementations, an applied charge can drive the display elements to change states.

The depicted portion of the array in FIG. 1 includes two adjacent interferometric MEMS display elements in the form of IMOD display elements 12. In the display element 12 on the right (as illustrated), the movable reflective layer 14 is illustrated in an actuated position near, adjacent or touching the optical stack 16. The voltage $V_{bias}$ applied across the display element 12 on the right is sufficient to move and also maintain the movable reflective layer 14 in the actuated position. In the display element 12 on the left (as illustrated), a movable reflective layer 14 is illustrated in a relaxed position at a distance (which may be predetermined based on design parameters) from an optical stack 16, which includes a partially reflective layer. The voltage $V_0$ applied across the display element 12 on the left is insufficient to cause actuation of the movable reflective layer 14 to an actuated position such as that of the display element 12 on the right.

In FIG. 1, the reflective properties of IMOD display elements 12 are generally illustrated with arrows indicating light 13 incident upon the IMOD display elements 12, and light 15 reflecting from the display element 12 on the left. Most of the light 13 incident upon the display elements 12 may be transmitted through the transparent substrate 20, toward the optical stack 16. A portion of the light incident upon the optical stack 16 may be transmitted through the partially reflective layer of the optical stack 16, and a portion will be reflected back through the transparent substrate 20. The portion of light 13 that is transmitted through the optical stack 16 may be reflected from the movable reflective layer 14, back toward (and through) the transparent substrate 20. Interference (constructive and/or destructive) between the light reflected from the partially reflective layer of the optical stack 16 and the light reflected from the movable reflective layer 14 will determine in part the intensity of wavelength(s) of light 15 reflected from the display element 12 on the viewing or substrate side of the device. In some implementations, the transparent substrate 20 can be a glass substrate (sometimes referred to as a glass plate or panel). The glass substrate may be or include, for example, a borosilicate glass, a soda lime glass, quartz, Pyrex®, or other suitable glass material. In some implementations, the glass substrate may have a thickness of 0.3, 0.5 or 0.7 millimeters, although in some implementations the glass substrate can be thicker (such as tens of millimeters) or thinner (such as less than 0.3 millimeters). In some implementations, a non-glass substrate can be used, such as a polycarbonate, acrylic, polyethylene terephthalate (PET) or polyether ether ketone (PEEK) substrate. In such an implementation, the non-glass substrate will likely have a thickness of less than 0.7 millimeters, although the substrate may be thicker depending on the design considerations. In some implementations, a non-transparent substrate, such as a metal foil or stainless steel-based substrate can be used. For example, a reverse-IMOD-based display, which includes a fixed reflective layer and a movable layer which is partially transmissive and partially reflective, may be configured to be viewed from the opposite side of a substrate as the display elements 12 of FIG. 1 and may be supported by a non-transparent substrate.

The optical stack 16 can include a single layer or several layers. The layer(s) can include one or more of an electrode layer, a partially reflective and partially transmissive layer, and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals (e.g., chromium and/or molybdenum), semiconductors, and dielectrics. The partially reflective layer can be formed of one or more layers of materials, and each of the layers can be formed of a single material or a combination of materials. In some implementations, certain portions of the optical stack 16 can include a single semi-transparent thickness of metal or semiconductor which serves as both a partial optical absorber and electrical conductor, while different, electrically more conductive layers or portions (e.g., of the optical stack 16 or of other structures of the display element) can serve to bus signals between IMOD display elements. The optical stack 16 also can include one or more insulating or dielectric layers covering one or more conductive layers or an electrically conductive/partially absorptive layer.

In some implementations, at least some of the layer(s) of the optical stack 16 can be patterned into parallel strips, and may form row electrodes in a display device as described further below. As will be understood by one having ordinary skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of supports, such as the illustrated posts 18, and an intervening sacrificial material located between the posts 18. When the sacrificial material is etched away, a defined gap 19, or optical cavity, can be formed between the movable reflective layer 14 and the optical stack 16. In some implementations, the spacing between posts 18 may be approximately 1-1000 μm, while the gap 19 may be approximately less than 10,000 Angstroms (Å).

In some implementations, each IMOD display element, whether in the actuated or relaxed state, can be considered as a capacitor formed by the fixed and moving reflective layers. When no voltage is applied, the movable reflective layer 14 remains in a mechanically relaxed state, as illustrated by the display element 12 on the left in FIG. 1, with the gap 19 between the movable reflective layer 14 and optical stack 16. However, when a potential difference, i.e., a voltage, is applied to at least one of a selected row and column, the capacitor formed at the intersection of the row and column electrodes at the corresponding display element becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated display element 12 on the right in FIG. 1. The behavior can be the same regardless of the polarity of the applied potential difference. Though a series of display elements in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. In some implementations, the rows may be referred to as "common" lines and the columns may be referred to as "segment" lines, or vice versa. Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

Figure 2:
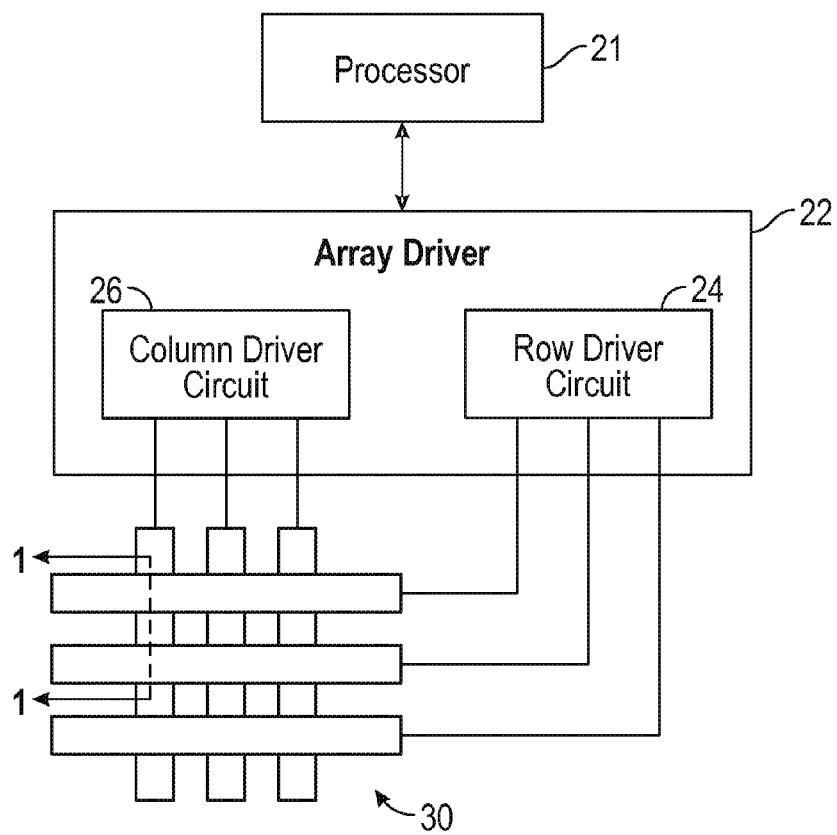
FIG. 2 is a system block diagram illustrating an electronic device incorporating an IMOD-based display including a three element by three element array of IMOD display elements.

FIG. 2 is a system block diagram illustrating an electronic device incorporating an IMOD-based display including a three element by three element array of IMOD display elements. Such an electronic device may include implementations of the TFTs disclosed herein. For example, a complementary metal-oxide-semiconductor (CMOS) TFT device may be used as part of a driving circuit, for example, of the electronic device illustrated in FIG. 2. The electronic device includes a processor 21 that may be configured to execute one or more software modules. In addition to executing an operating system, the processor 21 may be configured to execute one or more software applications, including a web browser, a telephone application, an email program, or any other software application.

The processor 21 can be configured to communicate with an array driver 22. The array driver 22 can include a row driver circuit 24 and a column driver circuit 26 that provide signals to, for example a display array or panel 30. The cross section of the IMOD display device illustrated in FIG. 1 is shown by the lines 1-1 in FIG. 2. Although FIG. 2 illustrates a 3×3 array of IMOD display elements for the sake of clarity, the display array 30 may contain a very large number of IMOD display elements, and may have a different number of IMOD display elements in rows than in columns, and vice versa.

Figure 3A:
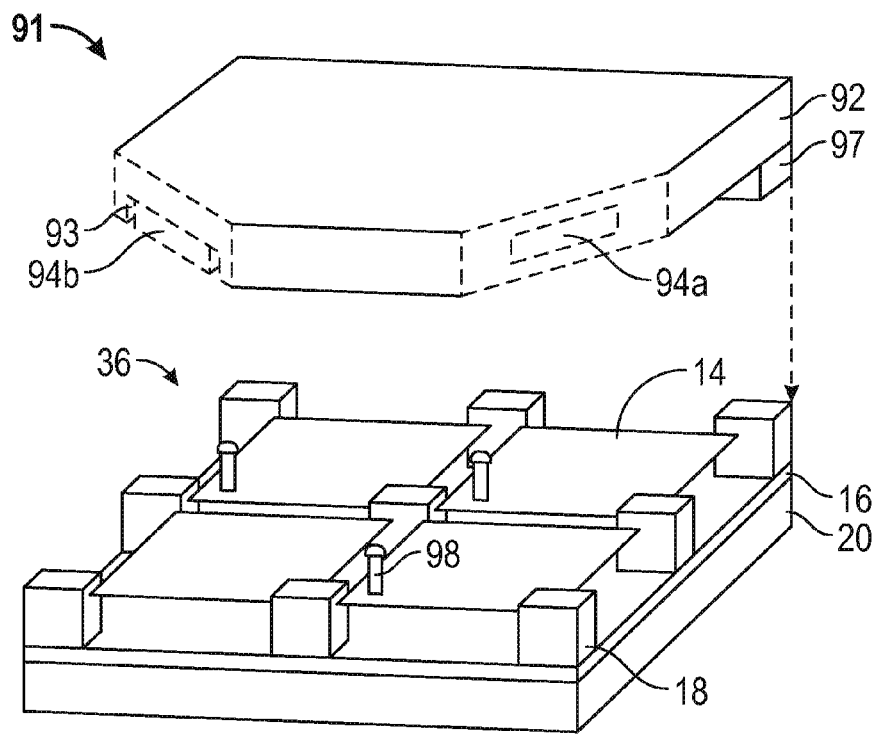
FIGS. 3A and 3B are schematic exploded partial perspective views of a portion of an electromechanical systems (EMS) package including an array of EMS elements and a backplate.
Figure 3B:
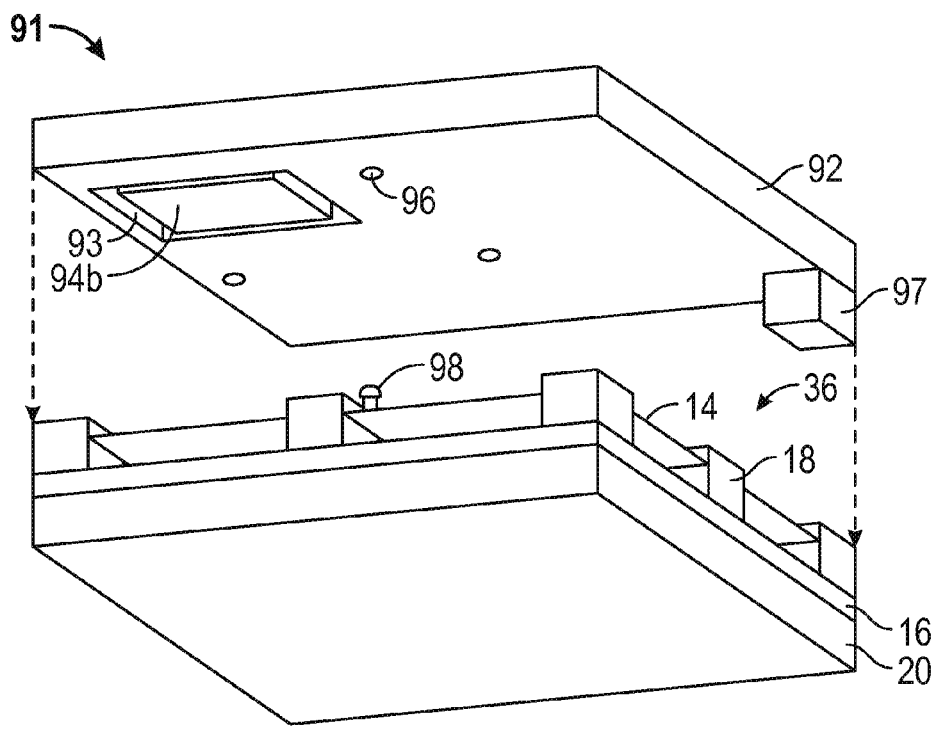

FIGS. 3A and 3B are schematic exploded partial perspective views of a portion of an EMS package 91 including an array 36 of EMS elements and a backplate 92. A TFT as disclosed herein may be implemented in the EMS package 91 shown in FIGS. 3A and 3B. For example, a TFT including a p-type metal oxide semiconductor channel may be implemented in a driver circuit on the backplate 92. FIG. 3A is shown with two corners of the backplate 92 cut away to better illustrate certain portions of the backplate 92, while FIG. 3B is shown without the corners cut away. The EMS array 36 can include a substrate 20, support posts 18, and a movable layer 14. In some implementations, the EMS array 36 can include an array of IMOD display elements with one or more optical stack portions 16 on a transparent substrate, and the movable layer 14 can be implemented as a movable reflective layer.

The backplate 92 can be essentially planar or can have at least one contoured surface (e.g., the backplate 92 can be formed with recesses and/or protrusions). The backplate 92 may be made of any suitable material, whether transparent or opaque, conductive or insulating. Suitable materials for the backplate 92 include, but are not limited to, glass, plastic, ceramics, polymers, laminates, metals, metal foils, Kovar and plated Kovar.

As shown in FIGS. 3A and 3B, the backplate 92 can include one or more backplate components 94a and 94b, which can be partially or wholly embedded in the backplate 92. As can be seen in FIG. 3A, backplate component 94a is embedded in the backplate 92. As can be seen in FIGS. 3A and 3B, backplate component 94b is disposed within a recess 93 formed in a surface of the backplate 92. In some implementations, the backplate components 94a and/or 94b can protrude from a surface of the backplate 92. Although backplate component 94b is disposed on the side of the backplate 92 facing the substrate 20, in other implementations, the backplate components can be disposed on the opposite side of the backplate 92.

The backplate components 94a and/or 94b can include one or more active or passive electrical components, such as transistors, capacitors, inductors, resistors, diodes, switches, and/or integrated circuits (ICs) such as a packaged, standard or discrete IC. Other examples of backplate components that can be used in various implementations include antennas, batteries, and sensors such as electrical, touch, optical, or chemical sensors, or thin-film deposited devices.

In some implementations, the backplate components 94a and/or 94b can be in electrical communication with portions of the EMS array 36. Conductive structures such as traces, bumps, posts, or vias may be formed on one or both of the backplate 92 or the substrate 20 and may contact one another or other conductive components to form electrical connections between the EMS array 36 and the backplate components 94a and/or 94b. For example, FIG. 3B includes one or more conductive vias 96 on the backplate 92 which can be aligned with electrical contacts 98 extending upward from the movable layers 14 within the EMS array 36. In some implementations, the backplate 92 also can include one or more insulating layers that electrically insulate the backplate components 94a and/or 94b from other components of the EMS array 36. In some implementations in which the backplate 92 is formed from vapor-permeable materials, an interior surface of backplate 92 can be coated with a vapor barrier (not shown).

The backplate components 94a and 94b can include one or more desiccants which act to absorb any moisture that may enter the EMS package 91. In some implementations, a desiccant (or other moisture absorbing materials, such as a getter) may be provided separately from any other backplate components, for example as a sheet that is mounted to the backplate 92 (or in a recess formed therein) with adhesive. Alternatively, the desiccant may be integrated into the backplate 92. In some other implementations, the desiccant may be applied directly or indirectly over other backplate components, for example by spray-coating, screen printing, or any other suitable method.

In some implementations, the EMS array 36 and/or the backplate 92 can include mechanical standoffs 97 to maintain a distance between the backplate components and the display elements and thereby prevent mechanical interference between those components. In the implementation illustrated in FIGS. 3A and 3B, the mechanical standoffs 97 are formed as posts protruding from the backplate 92 in alignment with the support posts 18 of the EMS array 36. Alternatively or in addition, mechanical standoffs, such as rails or posts, can be provided along the edges of the EMS package 91.

Although not illustrated in FIGS. 3A and 3B, a seal can be provided which partially or completely encircles the EMS array 36. Together with the backplate 92 and the substrate 20, the seal can form a protective cavity enclosing the EMS array 36. The seal may be a semi-hermetic seal, such as a conventional epoxy-based adhesive. In some other implementations, the seal may be a hermetic seal, such as a thin film metal weld or a glass frit. In some other implementations, the seal may include polyisobutylene (PIB), polyurethane, liquid spin-on glass, solder, polymers, plastics, or other materials. In some implementations, a reinforced sealant can be used to form mechanical standoffs.

In alternate implementations, a seal ring may include an extension of either one or both of the backplate 92 or the substrate 20. For example, the seal ring may include a mechanical extension (not shown) of the backplate 92. In some implementations, the seal ring may include a separate member, such as an O-ring or other annular member.

In some implementations, the EMS array 36 and the backplate 92 are separately formed before being attached or coupled together. For example, the edge of the substrate 20 can be attached and sealed to the edge of the backplate 92 as discussed above. Alternatively, the EMS array 36 and the backplate 92 can be formed and joined together as the EMS package 91. In some other implementations, the EMS package 91 can be fabricated in any other suitable manner, such as by forming components of the backplate 92 over the EMS array 36 by deposition.

Hardware and data processing apparatus may be associated with EMS structures. Such hardware and data processing apparatus may include a transistor switch, such as a thin film transistor (TFT). EMS display elements in a display device may be arranged in an array such as a two-dimensional grid and addressed by circuits associated with the rows and columns of the array. Row driver circuits may drive the gates of transistor switches that select a particular row to be addressed, and common driver circuits may provide a bias to a given row of display elements that may be synchronously updated with a row refresh.

A display device can include an array of display elements, which can be referred to as pixels. Some displays can include hundreds, thousands, or millions of pixels arranged in hundreds or thousands of rows and hundreds and thousands of columns. Each pixel can be driven by one or more TFTs. A TFT is a type of field-effect transistor made by depositing thin films of a semiconductor layer as well as one or more dielectric layers and conductive layers over a substrate. With increasing developments in flat panel displays, systems-on-glass, display devices, mobile devices, wearable devices, and the like, there is a growing demand for high performance TFTs.

Integrating switching matrices with driver circuits on a display backplate, as well as in other electronic devices, reduces manufacturing cost and failures associated with separately packaged IC drivers. Complementary metal-oxide-semiconductor (CMOS) circuits use n-type and p-type channels. Disclosed herein are p-type metal oxide semiconductor materials that exhibit good TFT performance, as well as TFTs including p-type metal oxide semiconductor channels. Also disclosed are circuits including n-type and p-type TFTs as well as electronic devices, such as display devices, that include such circuits. While the below description focuses on p-type metal oxide semiconductors in the context of TFTs, the p-type metal oxide semiconductors may also be employed in other contexts, such as in solar applications.

Figure 4A:
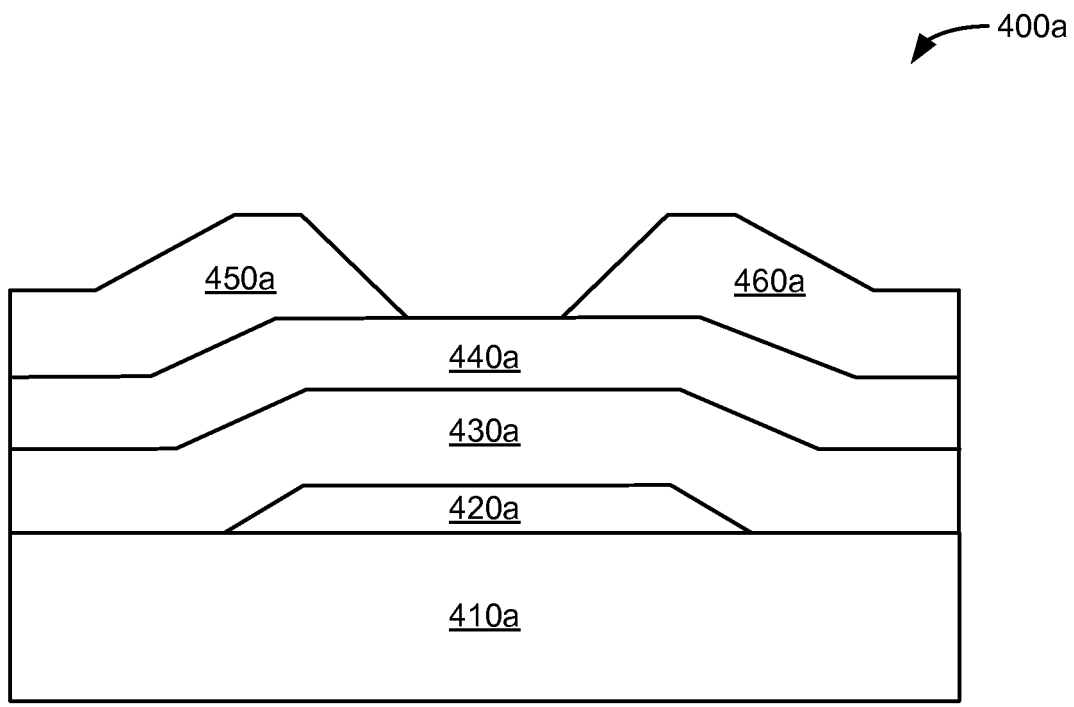
FIG. 4A is an example of a cross-sectional diagram illustrating a bottom gate thin film transistor (TFT) according to some implementations.

Generally, a TFT can include a semiconductor layer with a source region, a drain region, and a channel region in the semiconductor layer. As such, a TFT can be a three-terminal device that includes a source terminal, a drain terminal, and a gate terminal for modulating the conductivity of a channel. Some types of TFTs can be defined in terms of the location of the gate terminal. For example, types of TFT geometries can include a bottom gate geometry and a top gate geometry. FIG. 4A is an example of a cross-sectional diagram illustrating a bottom gate TFT according to some implementations. In FIG. 4A, a bottom gate TFT 400a includes a substrate 410a, a gate electrode 420a over the substrate 410a, a gate dielectric 430a over the gate electrode 420a, a semiconductor layer 440a over the gate dielectric 430a, a source electrode 450a over a source region of the semiconductor layer 440a, and a drain electrode 460a over a drain region of the semiconductor layer 440a, where a channel region in the semiconductor layer 440a is between the source region and the drain region. The semiconductor layer 440a electrically connects the source electrode 450a and the drain electrode 460a, with conductivity in the channel region a function of the potential applied across the gate electrode 420a and the source electrode 450a.

Figure 4B:
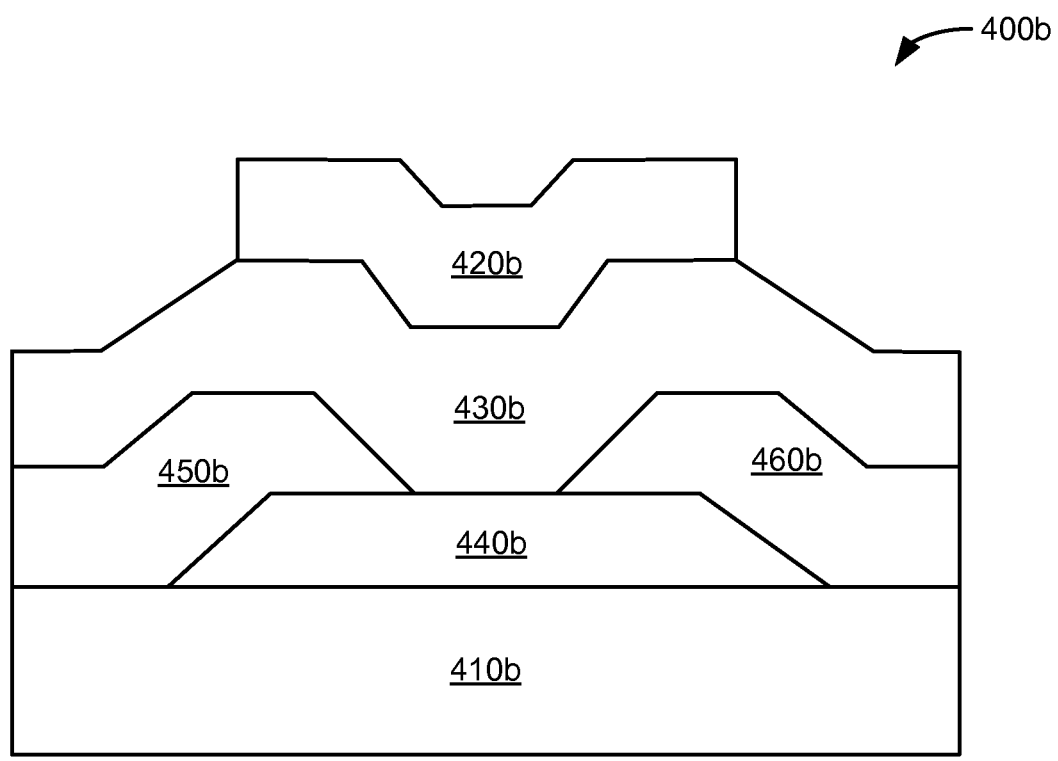
FIG. 4B is an example of a cross-sectional diagram illustrating a top gate TFT according to some implementations.

FIG. 4B is an example of a cross-sectional diagram illustrating a top gate TFT according to some implementations. In FIG. 4B, a top gate TFT 400b includes a substrate 410b, a semiconductor layer 440b over the substrate 410b, a source electrode 450b over a source region of the semiconductor layer 440b, a drain electrode 460b over a drain region of the semiconductor layer 440b, a gate dielectric 430b over the source electrode 450b, and a gate electrode 420b over the gate dielectric 430b, where a channel region is between the source region and the drain region of the semiconductor layer 440b. The semiconductor layer 440b electrically connects the source electrode 450b and the drain electrode 460b, with conductivity in the channel a function of the potential applied across the gate electrode 420b and the source electrode 450b.

The gate electrodes 420a and 420b may include one or more metals or other conductive materials. Examples of metals include aluminum (Al), copper (Cu), molybdenum (Mo), tantalum (Ta), chromium (Cr), neodymium (Nd), tungsten (W), titanium (Ti), gold (Au), nickel (Ni), and alloys containing any of these elements. In some implementations, each of the gate electrodes 420a and 420b can include two or more layers of different metals arranged in a stacked structure. In some implementations, each of the gate electrodes 420 can have a thickness between about 50 nm and about 500 nm, or between about 100 nm and about 250 nm.

The source electrodes 450a and 450b and the drain electrodes 460a and 460b may include any number of different metals or other conductive materials. Examples of metals include Mo, W, Au, Pt, Ag, Mg, Mn, Ti, Al, Cu, Ta, Cr, Nd, Ni, and alloys containing any of these elements. For example, the source electrodes 450a and 450b and the drain electrodes 460a and 460b may include a stable contact metal such as Mo, W, Au, Pt, and Ag. In some implementations, each of the source electrodes 450a and 450b and the drain electrodes 460a and 460b includes two or more sub-layers of different metals arranged in a stacked structure. In some implementations, each of the source electrodes 450a and 450b and the drain electrodes 460a and 460b can have a thickness between about 50 nm and about 500 nm, or between about 100 nm and about 250 nm.

The gate dielectrics 430a and 430b may also be referred to as gate insulators. Each of the gate dielectrics 430a and 430b may include any number of different dielectric materials, including silicon dioxide ($SiO_2$), aluminum oxide ($Al_2O_3$), hafnium oxide ($HfO_2$), yttrium oxide ($Y_2O_3$), titanium oxide ($TiO_2$), silicon oxynitride (SiON), silicon nitride (SiN), or organic dielectric materials. In some implementations, each of the gate dielectrics 430a and 430b can include two or more layers of dielectric materials arranged in a stacked structure. In some implementations, a thickness of a gate dielectric layer can be between about 50 nm and about 500 nm, or between about 100 nm and about 250 nm.

In FIGS. 4A and 4B, the bottom gate TFT 400a and the top gate TFT 400b can include metal oxide TFTs, where the semiconductor layers 440a and 440b can include a metal oxide. In a metal oxide TFTs, metal oxide semiconductor is deposited as an active channel layer in the TFT. A metal oxide TFT can have high mobility. According to various implementations, the metal oxide TFT is a p-type metal oxide TFT, where the semiconductor layers 440a and 440b can include a p-type metal oxide.

Most oxide semiconductors are n-type semiconductors, with few materials exhibiting p-type conduction. The p-type oxide semiconductors that are known are generally not suited for TFTs due to their high defect densities. However, the ability to form p-type, as well as n-type, oxide semiconductors TFTs allows CMOS TFT circuits to be made, for example.

Conventional p-type metal oxide thin films are deposited using physical vapor (PVD) techniques such as sputtering, vacuum evaporation and pulsed laser deposition. Because thin films formed by these techniques can be formed from p-type metal oxide source materials, it is relatively easy to form metal oxide thin films having p-type conductivity. For example, p-type tin (II) oxide (also known as stannous oxide or tin monoxide; SnO) thin films can be made by sputtering a ceramic SnO target. See, e.g., Po-Ching Hsu et al., 2013 Jpn. J. Appl. Phys. Vol. 52 Issue 5S1. In another example, p-type SnO thin films can be made by vacuum evaporation of SnO powder. See, e.g., Ho-Nyeon Lee et al. 2010 Jpn. J. Appl. Phys. 49, Issue 2R. However, deposition methods that rely on chemical reactions such as chemical vapor deposition (CVD) and atomic layer deposition (ALD) have not been used in part because of the difficulty in achieving thin films having p-type conductivity.

Many p-type semiconducting oxides are of interest as transparent conducting oxides (TCOs). However, while these materials may be useful as transparent conducting oxides, they typically are not of high enough quality for TFTs. This is due to the presence of defects in the bandgap. While such defects may not affect TCOs that exhibit metal-like conductivity in the conduction band, they greatly compromise TFT performance.

While defects in amorphous materials are harder to characterize than in crystalline materials, where any deviation from the crystalline structure is a defect, deviations from the coordination or stoichiometry of an amorphous material are defects. For example, amorphous tin monoxide (SnO) may have many metal or oxygen vacancies such that it is non-stoichiometric $Sn_{1-x}O$ or $SnO_{1-x}$. Defects in an ionic oxide can include metal cation vacancies ($V_M$), oxygen anion vacancies ($V_O$), oxygen anion interstitials ($O_i$), metal cation interstitials ($M_i$), as well as foreign cations, ions with zero effective charge, and charged vacancies.

In many cases, p-type metal oxide thin films that are deposited by PVD methods have high metal cation vacancy and/or oxygen anion vacancy densities. For example, PVD-deposited SnO layers have tin and oxygen vacancy defects greater than $10^{19}/cm^3$. These defects can function as hole trapping states and donor states, and may be the main cause for poor TFT performance of SnO TFTs. Further, p-type metal oxide thin films that are deposited by PVD methods may have an electrically inactive layer at the interface of the p-type oxide thin film and the underlying layer (e.g., at the p-type metal oxide/gate oxide interface of a bottom-gate TFT). For example, PVD-deposited SnO layers have an electrically active layer (also referred to as an incubation layer) as thick as about 10 nm. The high defect densities and incubation layers described above are not limited to SnO thin films and are observed in most p-type oxide semiconductors. (It should be noted that in certain references, there is a tendency to refer to a metal oxide omitting the ratios of the constituent ions. For example, indium gallium zinc oxide (IGZO) films are commonly referred to as InGaZnO or $InGaZnO_4$, though the ratio of ions may not be 1:1:1:1 or 1:1:1:4. Similarly, tin (IV) oxide ($SnO_2$) may be referred to as SnO in this shorthand manner. As used herein, however, SnO refers to stannous oxide (also known as tin monoxide; or tin (II) oxide). This is a distinct compound from tin (IV) oxide.)

Provided herein are methods of depositing p-type metal oxide thin films by atomic layer deposition (ALD). Also provided are ALD-deposited p-type metal oxide thin films and TFTs including ALD-deposited p-type metal oxide channels. ALD is a vapor phase deposition technique that involves exposing a substrate to sequential pulses of reactant gases. An ALD mechanism can result in surface-mediated reactions of adsorbed layers of reactants (also referred to as precursors) on the substrate surface. ALD technique is well-suited for precise tailoring of very thin films with film growth as fine as about 0.1 nm per cycle. Unlike PVD methods, in which the source material can be a p-type semiconductor, the ALD techniques disclosed herein form p-type semiconductors during the deposition process itself.

ALD processes may use surface-mediated deposition reactions to deposit films on a layer-by-layer basis. A first reactant can be directed over the substrate, with at least some of the first reactant chemisorbing or physisorbing onto the surface of the substrate to form a layer. The layer may be, though is not necessarily, a monolayer or sub-monolayer of the adsorbed reactant molecule. Deposition may be self-limited such that once a saturated layer is deposited, the reactant does not continue to adsorb on the surface. In some implementations, an ALD process may be performed in a sub-saturated regime. In such processes, one or more of the reactants may be limited such that a sub-saturated adsorbed layer is formed on the substrate surface.

A purge gas can be introduced to remove non-reacted reactant molecules and gaseous reaction byproducts. In some implementations, reactants may be alternatingly pulsed into a reaction chamber without intervening pulses of purge gases.

In some implementations, the first reactant can decompose to form a film layer. In some other implementations, a second reactant can be introduced which can react with the layer of the first reactant. Thermal energy can be provided to the substrate to activate surface reactions between the first reactant and the second reactant to form a film layer. Other energetic means, such as a plasma, may be combined with the thermal energy to drive the reaction between the first reactant and the second reactant. A purge gas may be subsequently introduced to remove excess reactants and gaseous reaction byproducts. This may complete one cycle of a multi-cycle ALD process. The reactants can be alternately pulsed into the reaction chamber with little to no overlap. The cycles may be repeated as many times as desired to form a film of a suitable thickness. As described further below, ALD deposition of p-type metal oxide thin films generally involves sequential pulses of a metal reactant and an oxidant. In some implementations, ternary or higher order p-type metal oxide thin films may be formed using multiple different metal reactants, with a cycle including, for example, sequential pulses of a first metal reactant, a second metal reactant, and an oxidant.

Thickness of the ALD-deposited p-type metal oxide thin films can be controlled by the number of ALD cycles. One cycle may take time from about 0.5 seconds to a few tens of seconds and deposit between about 0.1 nm and about 0.4 nm thickness of material. Thus, each of the ALD-deposited p-type metal oxide thin films can be precisely tailored within 0.1 nm accuracy.

ALD deposition of a p-type metal oxide semiconductor is challenging because ALD reactions between a metal reactant and an oxidant can form n-type metal oxide semiconductors or insulators. As discussed above, this is not an issue for PVD thin film deposition techniques, which can start with a p-type metal oxide material. Methods of ALD deposition of p-type metal oxide semiconductors are discussed further below with reference to FIG. 5.

Figure 5:
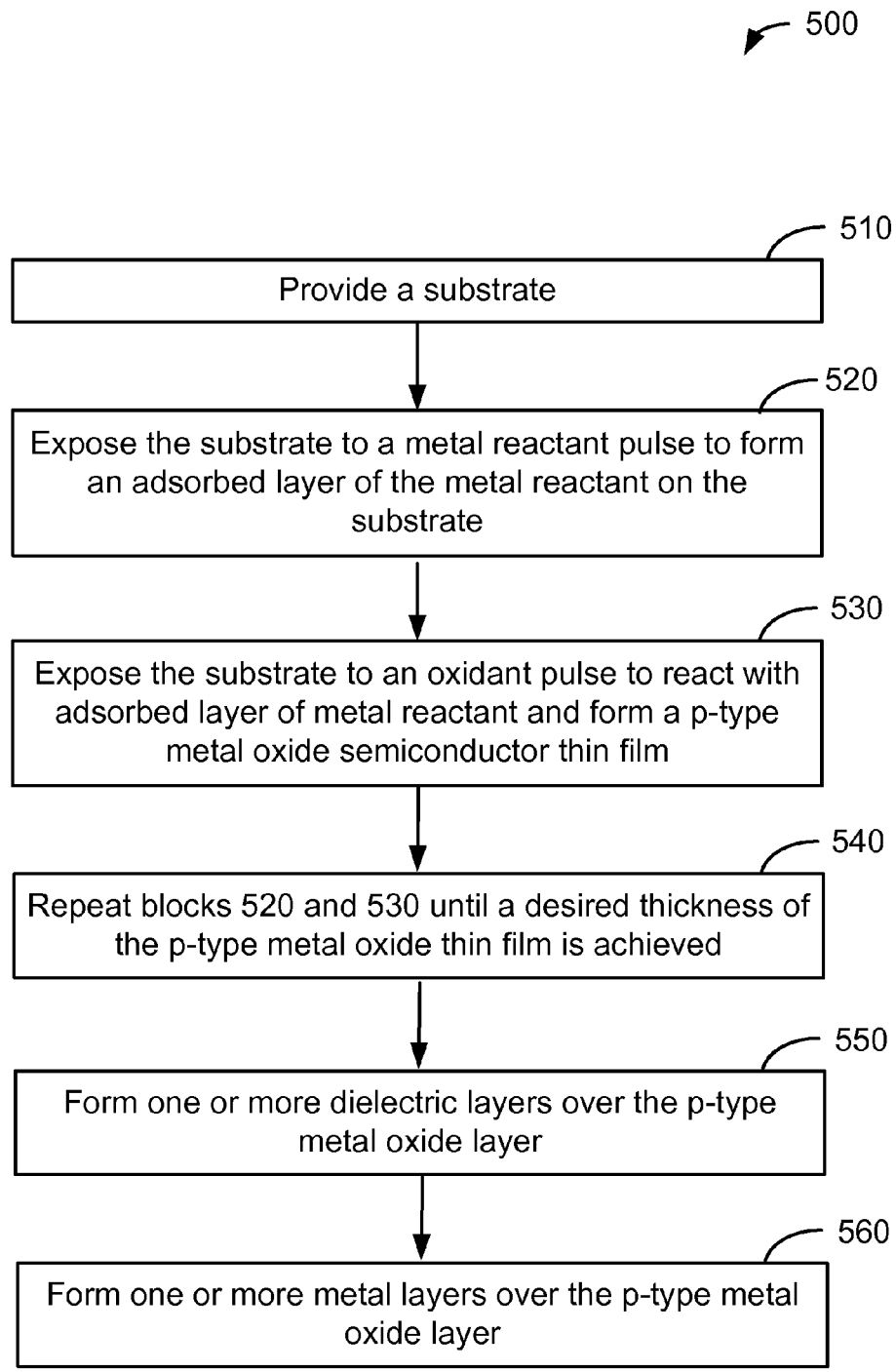
FIG. 5 is a flow diagram illustrating an example of a method of fabricating a p-type metal oxide layer according to some implementations.

FIG. 5 is a flow diagram illustrating an example of a method of fabricating a p-type metal oxide layer according to some implementations. The process 500 may be performed with different, fewer or additional operations. In some implementations, the process 500 may be described with reference to one or more processing chambers and a controller, where the controller may be programmed to control any operations described herein.

At block 510 of the process 500, a substrate is provided. The substrate can include any substrate material, including a substantially transparent material, such as glass or plastic. Substantial transparency as used herein can be defined as transmittance of visible light of about 70% or more, such as about 80% or more, or about 90% or more. Glass substrates (sometimes referred to as glass plates or panels) may be or include a borosilicate glass, a soda lime glass, photoglass, quartz, Pyrex®, or other suitable glass material. A non-glass substrate can be used, such as a polycarbonate, acrylic, polyimide, polyethylene terephthalate (PET), or polyether ether ketone (PEEK) substrate. Other suitable substrate materials can include flexible substrate materials. In some implementations, the substrate can have dimensions of a few microns to hundreds of microns.

At block 520 of the process 500, the substrate is exposed to a metal reactant pulse to form an adsorbed layer of the metal reactant on the substrate. Metal reactants that may be used to form p-type metal oxide thin films are described further below, with examples including Sn(II)-organometallic compounds.

In some implementations, the process 500 may involve treating the substrate prior to block 520 to facilitate adsorption of the metal reactant. For example, in some implementations, the substrate surface may be exposed to a hydrogen- or hydroxyl-containing chemistry to form hydroxyl groups on at least the portion of the substrate on which p-type metal oxide deposition is desired. Block 520 may then involve anchoring the metal reactant to the hydroxyl groups.

At block 530 of the process 500, the substrate including the adsorbed layer of metal reactant is exposed to an oxidant pulse to reactant with the adsorbed metal reactant to form a p-type metal oxide semiconductor. Oxidants that may be used to form p-type metal oxide thin films include oxygen ($O_2$), ozone ($O_3$), water ($H_2O$), hydrogen peroxide ($H_2O_2$), and combination thereof. In some implementations, block 530 may be preceded and/or succeeded by purges to remove excess reactants and/or reaction byproducts.

The substrate may be in a deposition chamber in blocks 520 and 530 with chamber pressure varied according to the particular precursor and process employed, with examples of chamber pressure ranging from 0.1 Torr to 760 Torr. As discussed further below, chamber temperature is controlled to facilitate deposition of a p-type metal oxide film. In some implementations, temperatures are below about 400° C., and more particularly, below about 300° C.

At block 540 of the process 500, blocks 520 and 530 are repeated until the desired thickness of the p-type metal oxide semiconductor thin film is achieved. In some implementations, the p-type metal oxide semiconductor thin film can be between about 10 nm and about 100 nm thick.

The p-type metal oxide semiconductor thin film can include a channel region aligned or to be aligned with a gate electrode, where the channel region is between a source region and a drain region of the oxide semiconductor layer. Forming the source and drain regions of the p-type metal oxide semiconductor layer can involve doping these regions of the p-type metal oxide semiconductor layer.

In some implementations, the process can continue with forming one or more dielectric layers or metal layers over the p-type metal oxide layer. For example, at block 550 of the process 500, one or more dielectric layers may be formed over the oxide semiconductor layer. In some implementations, a dielectric layer contacts the p-type oxide semiconductor layer. The one or more dielectric layers may include a passivation layer, a gate dielectric layer, and an etch stop layer, for example. The one or more dielectric layers can include any suitable dielectric material including oxides, such as $SiO_2$ or $Al_2O_3$, and nitrides. In some implementations, a dielectric layer can be between about 10 nm and about 1000 nm thick, such as between about 300 nm and about 500 nm thick. The p-type metal oxide semiconductor layer and the dielectric layer can form part of a TFT.

The process 500 can continue at block 560 by forming one or more metal layers. In some implementations, block 560 includes forming a source electrode on a source region of the p-type oxide semiconductor layer and forming a drain electrode on a drain region of the p-type oxide semiconductor layer. To form the source electrode and the drain electrode, the source electrode and the drain electrode may be etched. Thus, block 560 may include etching the source electrode and the drain electrode to expose the channel region of the oxide semiconductor layer. In some implementations, forming the dielectric layer in block 550 occurs before forming a source electrode and a drain electrode. This can include instances where the dielectric layer is an etch stop layer or a gate dielectric. In some implementations, forming a dielectric layer in block 550 can occur after forming the source electrode and the drain electrode. This can include instances where the dielectric layer is a passivation layer formed over the source electrode and the drain electrode to protect the TFT.

In some implementations, the process 500 further includes forming a gate electrode over the substrate. In some implementations, the gate electrode may be formed on the substrate, and a gate dielectric may be formed on the gate electrode for a bottom gate TFT. In some implementations, the dielectric oxide layer may serve as the gate dielectric, and the gate electrode may be formed over the gate dielectric for a top gate TFT.

As discussed above, ALD deposition of a p-type metal oxide semiconductor is challenging because ALD reactions between a metal precursor and an oxidant can form n-type metal oxide semiconductors or insulators. According to various implementations, the ALD methods provided herein deposit p-type metal oxide semiconductors using one or more techniques including precursor selection, temperature control, and limiting oxidation. These techniques, discussed further below, may be used in some implementations of the methods described above with reference to FIG. 5 and below with reference to FIGS. 6-8.

For deposition of tin-based oxides, precursors that may be used are tin (II)-based organic precursors such as bis[bis(trimethylsilyl)amino]tin (II), tin (II) acetylacetonate, and tin (II) 2,4-pentanedionate. Syntheses of examples of N-heterocyclic stannylene compounds such as bis(N,N'-diisopropylacetamidinato) tin (II) and tin (II) amidinates such as rac-1,3-di-tert-butyl-4,5-dimethyl-1,3-diaza-2-stannacyclopentane-2-ylidene that also may be used are described in Sang Bok Kim et al., Chem. Mater. 2014, 26, 3065-3073.

Precursors that may be used for deposition of Cu-based oxides are Cu(I)-based organic precursors such as bis(tri-n-butylphosphane)-copper(I)acetylacetonate. See Thomas Waechtler, et al., J. Electrochem. Soc., Vol. 156, No. 6, H453-H459 (2009). Copper(I) chloride may also be used for ALD deposition of $Cu_2O$.

In some implementations, depositing a p-type metal oxide semiconductor involves controlling temperature such that a p-type metal oxide semiconductor, rather than an n-type metal oxide semiconductor or an oxide insulator, is formed during deposition. Temperature control can also ensure that the p-type metal oxide semiconductor is not converted to an n-type metal oxide semiconductor or an insulator after a deposition cycle. For deposition of SnO by ALD, in some implementations, the temperature may be below about 400° C., and more particularly, below about 300° C. Such temperatures can aid in preventing formation of n-type $SnO_2$. In some implementations, deposition of ALD-deposited SnO film occurs at temperature between about 50° C. and about 300° C. As discussed further below, in some implementations, ALD deposition of SnO is performed with hydrogen-containing oxidants and/or in a hydrogen environment to facilitate incorporation of hydrogen into the deposited thin film. In such implementations, the deposition temperature may be at least about 150° C., e.g., between about 150° C. and 300° C., or between about 150° C. to 250° to facilitate hydrogen incorporation while preventing oxidation to $SnO_2$.

Examples of oxidants that may be employed include $O_2$, $O_3$, $H_2O$, $H_2O_2$ and combinations thereof. In some implementations, a hydrogen-containing oxidant such as water or hydrogen peroxide is employed. Such an oxidant may be, in some implementations, a hydrogen source for the deposited thin film. In some implementations, a relatively weak oxidant may be employed (either alone or as a diluent of a stronger oxidant) to facilitate formation of a p-type semiconductor. Examples of weak oxidants include water, carbon dioxide ($CO_2$), carbon monoxide (CO), methanol ($CH_3OH$), ethanol ($C_2H_6OH$), isopropyl alcohol ($C_3H_7OH$) and combinations thereof.

In some implementations, a hydrogenated ALD-deposited p-type metal oxide semiconductor layer is provided. As discussed in U.S. Provisional Patent Application No. 62/078,874, filed Nov. 12, 2014, titled "Hydrogenated P-Channel Metal Oxide Semiconductor Thin Film Transistors," which is incorporated by reference herein, p-type channel TFTs having a hydrogen content of at least $10^{18}$ atoms/cm$^3$, and in some implementations, at least $10^{20}$ atoms/cm$^3$, or higher may have high mobility, low sub-threshold swing (s-value), and high on/off current ratio. Hydrogen can be incorporated into a thin film by one or more of: use of a hydrogen-containing oxidant as discussed above, by performing the ALD deposition in a hydrogen-containing atmosphere, by a post-deposition thermal anneal in a hydrogen-containing atmosphere, or by post-deposition diffusion from an adjacent layer. Further, as discussed further below with respect to FIG. 9, hydrogen may be introduced as a dopant in an ALD cycle in some implementations.

In some implementations, plasma energy may be applied during one or more of the reactant pulses. For example, a cycle may include the following sequence: metal reactant (plasma off)/purge/oxidant (plasma on)/purge. In some implementations, plasma may be applied during a hydrogen-containing oxidant to facilitate hydrogen incorporation into the film. In some implementations, a relatively low temperature (e.g., below about 300° C., below about 250° C., or below about 200° C.) during ALD deposition of the p-type metal oxide thin film, with plasma energy applied during oxidant pulses.

According to various implementations, the p-type metal oxide semiconductors that may be deposited may be doped or undoped binary compounds such SnO and $Cu_2O$, as well as ternary or higher order compounds such as tin (II)-based ternary oxides and tin (II)-based quaternary oxides.

Examples of tin (II)-based ternary oxide films include Sn(II)-X—O, with X being one of titanium (Ti), tungsten (W), boron (B), or niobium (Nb). Examples of titanium precursors that may be used in ALD deposition of Sn(II)-Ti—O include organotitanium compounds such as tetrakis (diethylamido)titanium(IV), bis(tert-butylcyclopentadienyl) titanium(IV) dichloride, and titanium(IV) diisopropoxidebis (2,2,6,6-tetramel'yl-3,5-heptanedionate), tetraethoxytitanium, tetramethoxytitanium, and tetraizopropoxytitanium. Examples of tungsten precursors that may be used in ALD deposition of Sn(II)-W—O include tungsten hexafluoride, tungsten hexachloride, and tungsten hexacarbonyl. In some embodiments, organotungsten compounds such as tungsten bis(alkylimino)bis(alkylamino) compounds (e.g., bis(tert-butylimino)bis(dimethylamino)tungsten(VI) and hexakis(dimethylamido)tungsten(VI)) may be used. Examples of boron precursors that may be used in ALD deposition of Sn(II)-B—O include boron tribromide and boranes including borane ($BH_3$), diborane ($B_2H_6$), triborane ($B_3H_7$). Examples of niobium precursors that may be used in ALD deposition of Sn(II)-Nb—O include organoniobium compounds such as niobium(V) ethoxide and tris(diethylamido)(tert-butylimido)niobium(V).

Other compounds that may be incorporated into ALD deposited Sn(II)-based films (either as a constituent of a higher order film or a dopant) can include calcium (Ca), hafnium (Hf), tantalum (Ta), silicon (Si), molybdenum (Mo), aluminum (Al), gallium (Ga), lead (Pb), and silver (Ag). Any precursor appropriate for ALD deposition may be used in such implementations.

Figure 6:
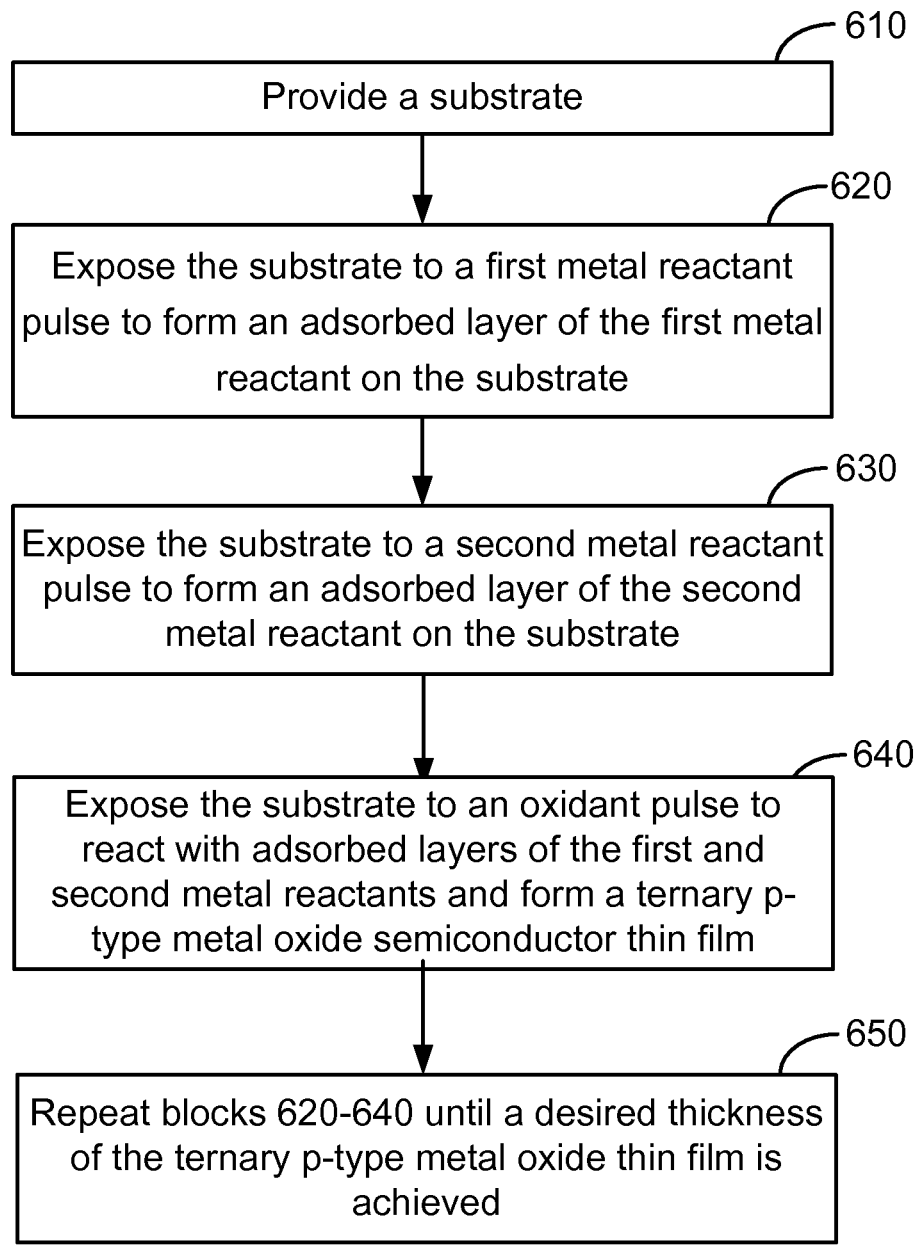
FIGS. 6 and 7 are flow diagrams illustrating examples of methods of fabricating ternary p-type metal oxide semiconductor thin films according to some implementations.
Figure 7:
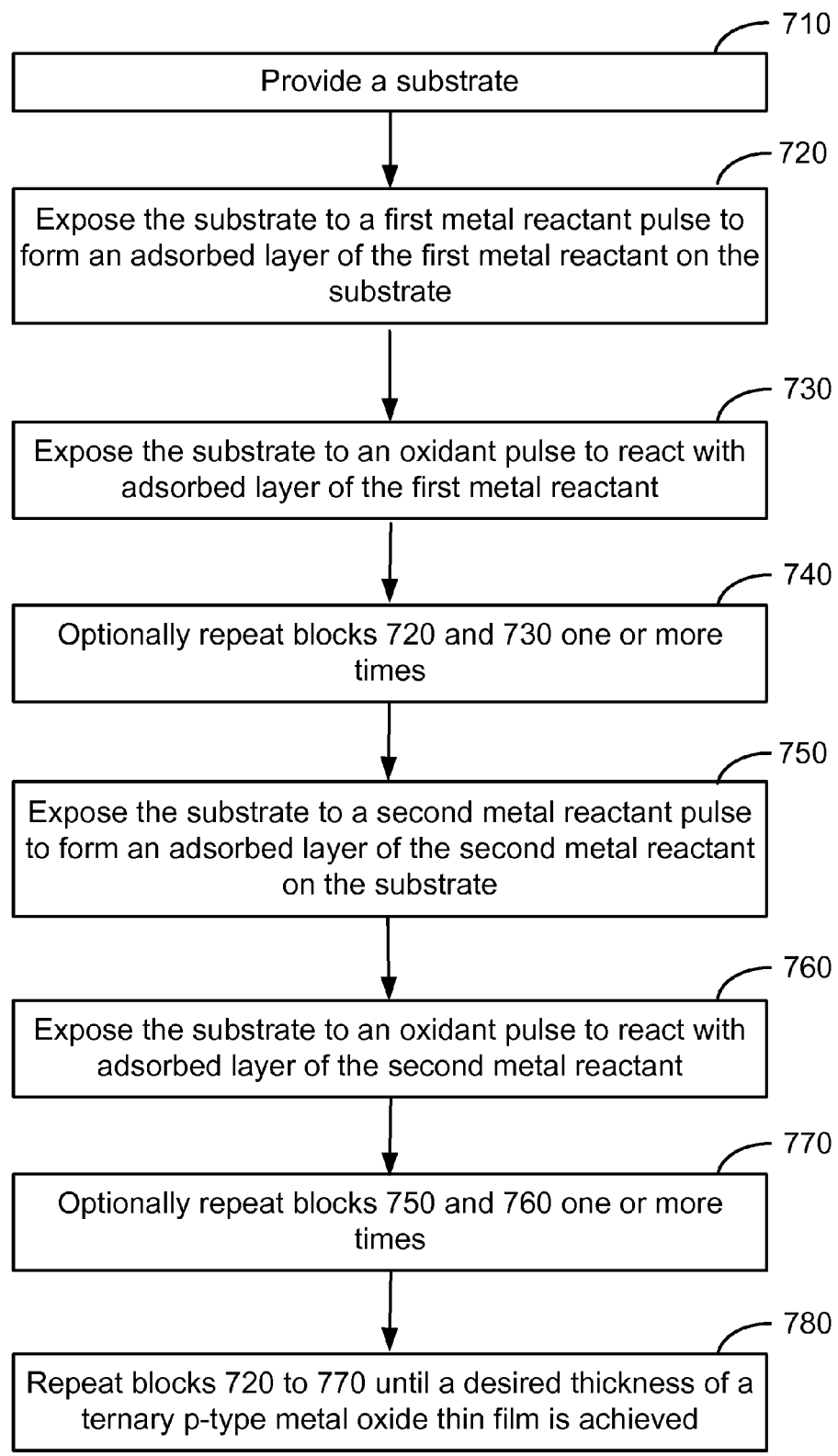

Various reactant pulse sequences may be employed to deposit ternary or higher order p-type metal oxide semiconductor thin films by ALD. FIGS. 6 and 7 are flow diagrams illustrating examples of methods of fabricating ternary p-type metal oxide semiconductor thin films according to some implementations.

Turning first to FIG. 6, at block 610 of the process 600, a substrate is provided. The substrate can include any substrate material as discussed above with respect to block 510 of FIG. 5. At block 620 of the process 500, the substrate is exposed to a first metal reactant pulse to form an adsorbed layer of the first metal reactant on the substrate. For example, a first metal reactant may be a Sn(II)-organometallic compound as described above.

At block 630 of the process 600, the substrate including the adsorbed layer of the first metal reactant is exposed to a second metal reactant pulse to form an adsorbed layer of the second metal reactant. In one example, the second metal reactant may be a tungsten, titanium, niobium, or boron reactant.

At block 640 of the process 600, the substrate is exposed to an oxidant pulse to react with the adsorbed layers of the first and second reactants and form a ternary p-type metal oxide semiconductor thin film. At block 650 of the process, blocks 620 to 640 are repeated until a desired thickness of the ternary p-type metal oxide semiconductor thin film is achieved.

In some implementations, blocks 620 and 630 may be performed such that the first and second metal reactants are introduced at the same time, forming an adsorbed layer including both of these reactants. Additional details according to various implementations of the process 600 such as purges, temperatures, oxidants, additional operations, etc. are described above with respect to FIG. 5.

In FIG. 7, at block 710 of the process 700 a substrate is provided as described above with respect to FIGS. 5 and 6. At block 720 of the process 700, the substrate is exposed to a first metal reactant pulse to form an adsorbed layer of the first metal reactant on the substrate. For example, a first metal reactant may be a Sn(II)-organometallic compound as described above. At block 730 of the process 700, the substrate is exposed to an oxidant pulse to react with the adsorbed layer of the first reactant. At block 740 of the process, blocks 720 and 730 are optionally repeated one or more times. At block 750 of the process 700, the substrate is exposed to a second metal reactant pulse to form an adsorbed layer of the second metal reactant. In one example, the second metal reactant may be a tungsten, titanium, niobium, or boron reactant. At block 760 of the process 700, the substrate is exposed to an oxidant pulse to react with the adsorbed layer of the second reactant and form a ternary p-type metal oxide semiconductor thin film. At block 770 of the process 700, blocks 750 and 760 are optionally repeated one or more times. At block 780 of the process 700, blocks 720 to 770 are repeated until the desired thickness of the ternary p-type metal oxide semiconductor thin film is achieved. Additional details according to various implementations of the process 700 such as purges, temperatures, oxidants, additional operations, etc. are described above with respect to FIG. 5.

According to various implementations, the relative ratios of the first and second metal reactants may be controlled by varying flow rates, dose times, or concentrations of the first and second metal reactant pulses, as well as the number of cycles that include each of these pulses.

Figure 8:
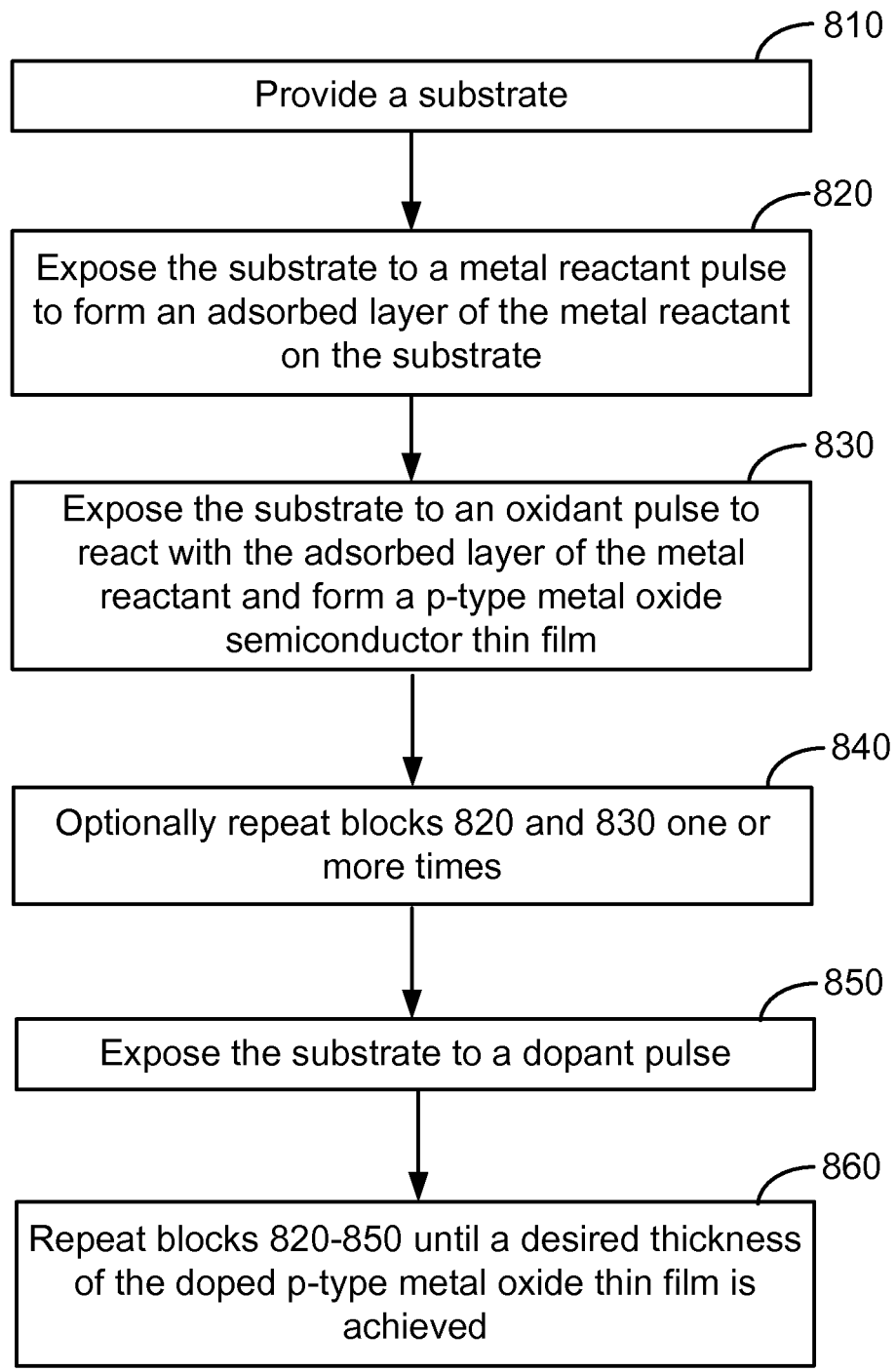
FIG. 8 is a flow diagram illustrating an example of a method of fabricating a doped p-type metal oxide layer according to some implementations.

FIG. 8 is a flow diagram illustrating an example of a method of fabricating a doped p-type metal oxide layer according to some implementations. Examples of dopants can include hydrogen and metals. A dopant is typically present at much lower levels than a metal cation constituent of a ternary or higher order metal oxide compound. For example, in a p-type metal oxide film having the formula $A_xB_yO$, B may be considered a dopant if y is less than 0.1. A dopant may also be characterized as being less than 1% (atomic) of the thin film. In FIG. 8, at block 810 of the process 800 a substrate is provided as described above. At block 820 of the process 800, the substrate is exposed to a first metal reactant pulse to form an adsorbed layer of the first metal reactant on the substrate. At block 830 of the process 800, the substrate is exposed to an oxidant pulse to react with the adsorbed layer of the first reactant. At block 840 of the process 800, blocks 820 and 830 are optionally repeated one or more times. In some implementations, blocks 820 are 830 are not repeated such that the dopant is incorporated into the film after each cycle defined by these blocks. At block 850 of the process 800, the substrate is exposed to a dopant pulse. According to various implementations, block 850 may include exposing the substrate to vapor or plasma including the dopant species. For example, block 850 may include exposing the substrate to a hydrogen (H$_2$) plasma. At block 860 of the process 800, blocks 820 to 850 are repeated until the desired thickness of the doped p-type metal oxide semiconductor thin film is achieved. In various implementations, blocks 820 and 830 involve depositing ternary p-type metal oxide semiconductors film, for example as described in FIGS. 6 and 7.

An ALD-deposited p-type metal oxide channel of a TFT fabricated by the methods described in FIGS. 5-8 may be characterized by a low defect density. In some implementations, an ALD-deposited Sn(II)-based p-type metal oxide semiconductor channel has a combined oxygen and tin vacancy defect density of less than about $10^{19}$/cm$^3$. In some implementations, the channel may be characterized as being electrically active throughout the thickness of the channel. In some implementations, the channel has a thickness of 15 nm or less or 10 nm or less.

In some implementations, the semiconductor channels disclosed herein are essentially pure films of the ALD-deposited p-type material, rather than mixtures of multiple forms of the oxide and/or a metallic element. For example, while SnO is a p-type material, SnO2 is an n-type material. Substantially no (less than 5%) or no tin (IV) oxide or metallic tin (Sn) may be present in the ALD-deposited p-type material or TFT channel. In some implementations, the purity may be 95% or higher, such as 99%.

Figure 9:
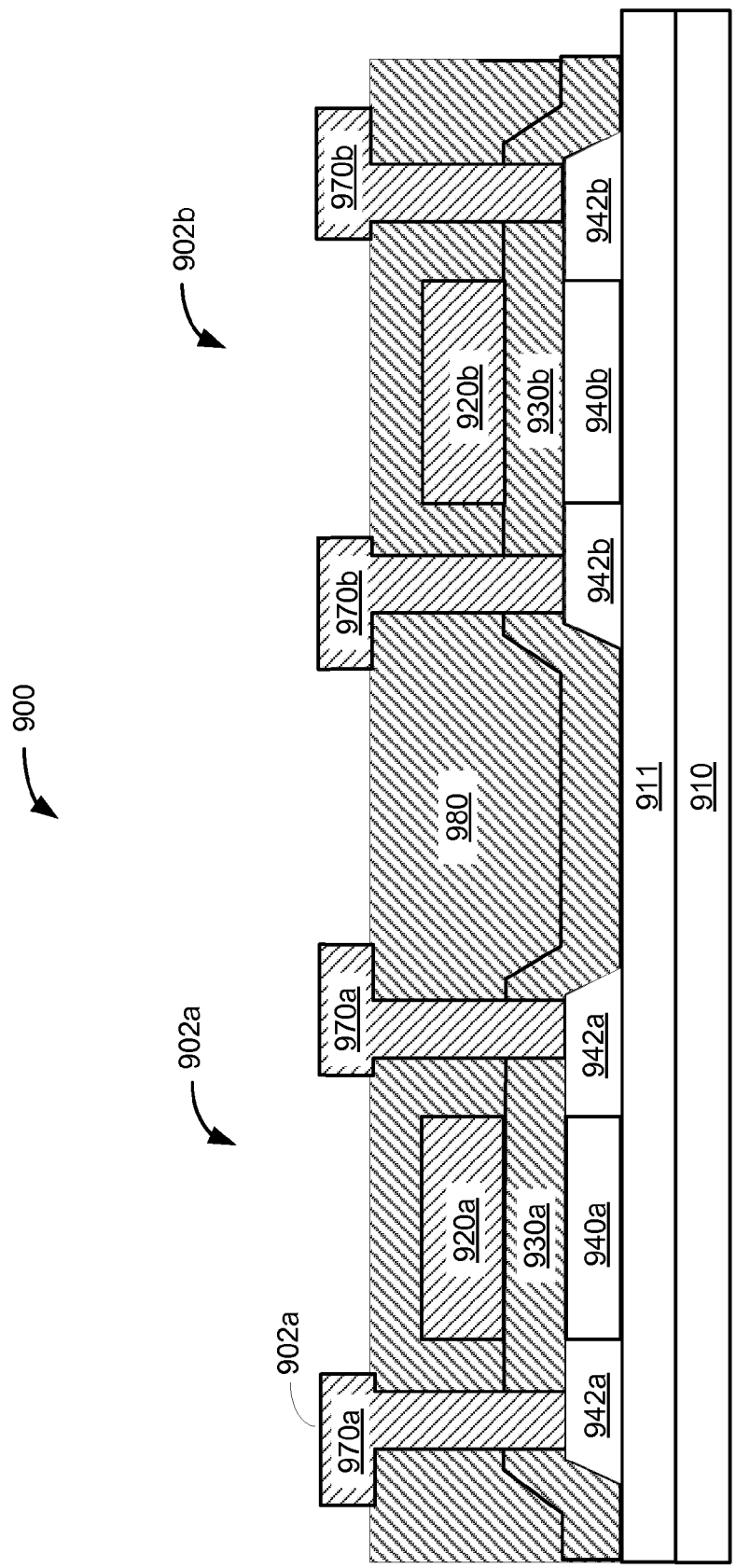
FIG. 9 is an example of a cross-sectional diagram illustrating a complementary metal-oxide-semiconductor (CMOS) TFT device according to some implementations.

In some implementations, the ALD-deposited p-type metal oxide semiconductor layer may form part of a CMOS TFT device including a p-type TFT and an n-type TFT. FIG. 9 is an example of a cross-sectional diagram illustrating a CMOS TFT device according to some implementations. In FIG. 9, a CMOS TFT device 900 includes a p-type top gate TFT 902a and an n-type top gate TFT 902b on a substrate 910. Examples of substrates are described above. In the example of FIG. 9, the p-type top gate TFT 902a and the n-type top gate TFT 902b are formed on a dielectric layer 911; in some implementations, however, they may be formed on the substrate 910 as in the example of FIG. 4B.

The p-type top gate TFT 902a includes an ALD-deposited p-type metal oxide semiconductor layer including a channel region 940a and source and drain regions 942a. Source and drain electrodes 970a contact the source and drain regions 942a of the ALD-deposited p-type metal oxide semiconductor layer, and a gate electrode 920a overlies a gate dielectric 930a. The ALD-deposited p-type metal oxide semiconductor layer of the p-type TFT 902a may include any of the ALD-deposited p-type metal oxides discussed above.

The n-type top gate TFT 702b includes an n-type metal oxide semiconductor layer including a channel region 740b and source and drain regions 742b. Source and drain electrodes 770b contact the source and drain regions 742b of the n-type metal oxide layer, and a gate electrode 720b overlies a gate dielectric 730b. The source and drain electrodes 770a and 770b may be formed in a dielectric layer 780, which separates the p-type top gate TFT 702a and the n-type top gate TFT 702b.

In some implementations, the n-type metal oxide semiconductor is amorphous and can include indium (In)-containing, zinc (Zn)-containing, tin (Sn)-containing, hafnium (Hf)-containing, and gallium (Ga)-containing oxide semiconductors. Examples of n-type amorphous oxide semiconductors include InGaZnO, InZnO, InHfZnO, InSnZnO, SnZnO, InSnO, GaZnO, and ZnO.

In some implementations, the p-type metal oxide semiconductor and the n-type metal oxide semiconductor may be differently doped films of the same metal oxide. For example, the p-type metal oxide semiconductor may be ALD-deposited SnO as described above and the n-type metal oxide semiconductor may be SnO doped with antimony (Sb) to form an n-type metal oxide semiconductor. In some implementations, the n-type metal oxide semiconductor may be an ALD-deposited thin film.

In some implementations, the CMOS TFT includes bottom gate TFTs as discussed above with reference to FIG. 4A. A CMOS TFT device, such as shown in the example of FIG. 9, may be used as part of a driving circuit, for example, of a display device.

Figure 10A:
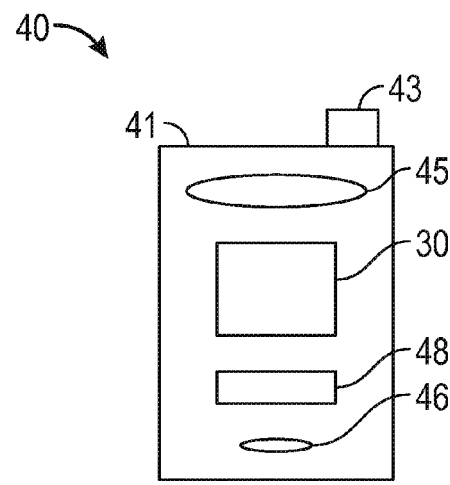
FIGS. 10A and 10B are system block diagrams illustrating a display device that includes a plurality of IMOD display elements.
Figure 10B:
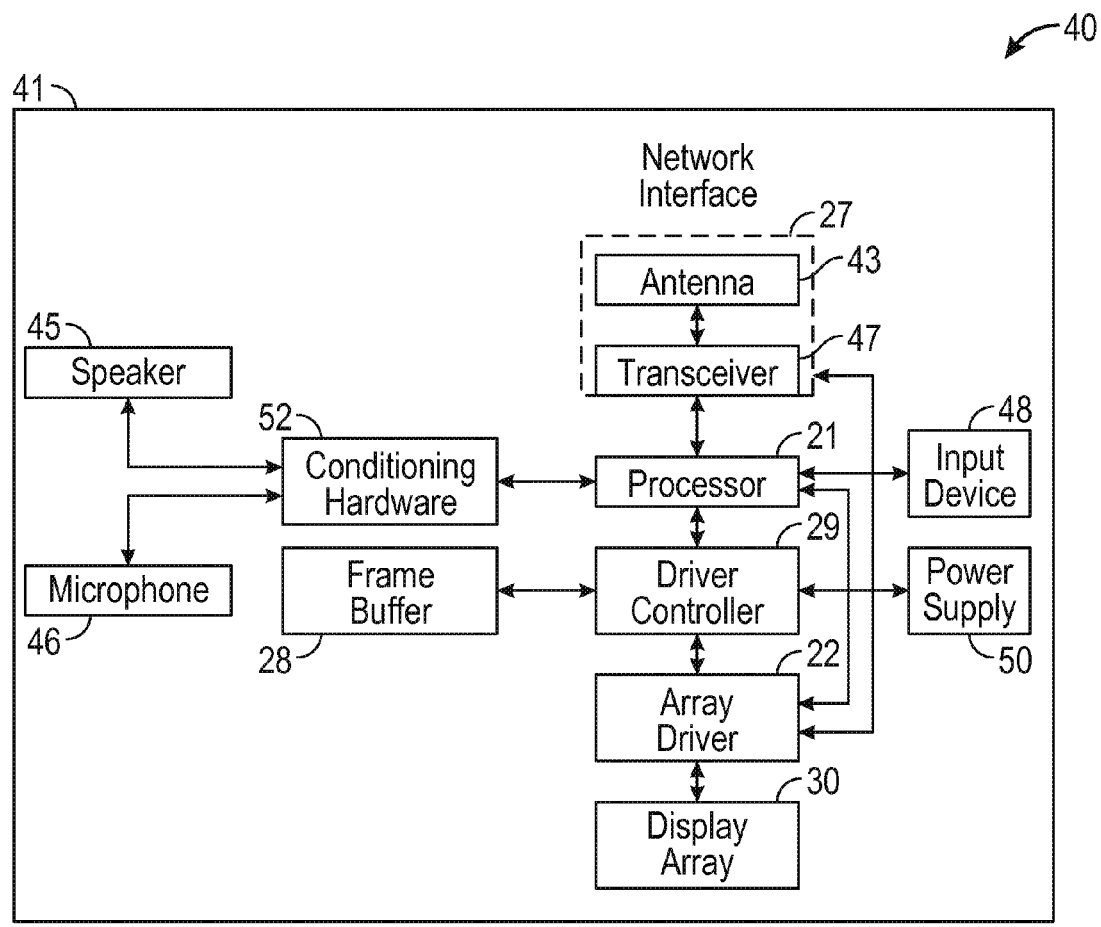

FIGS. 10A and 10B are system block diagrams illustrating a display device 40 that includes a plurality of IMOD display elements and a TFT as described herein. The display device 40 can be, for example, a smart phone, a cellular or mobile telephone. However, the same components of the display device 40 or slight variations thereof are also illustrative of various types of display devices such as televisions, computers, tablets, e-readers, hand-held devices and portable media devices.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an IMOD-based display, as described herein.

The components of the display device 40 are schematically illustrated in FIG. 8A. The display device 40 includes a housing 41 and can include additional components at least partially enclosed therein. For example, the display device 40 includes a network interface 27 that includes an antenna 43 which can be coupled to a transceiver 47. The network interface 27 may be a source for image data that could be displayed on the display device 40. Accordingly, the network interface 27 is one example of an image source module, but the processor 21 and the input device 48 also may serve as an image source module. The transceiver 47 is connected to a processor 21, which is connected to conditioning hardware 52. The conditioning hardware 52 may be configured to condition a signal (such as filter or otherwise manipulate a signal). The conditioning hardware 52 can be connected to a speaker 45 and a microphone 46. The processor 21 also can be connected to an input device 48 and a driver controller 29. The driver controller 29 can be coupled to a frame buffer 28, and to an array driver 22, which in turn can be coupled to a display array 30. One or more elements in the display device 40, including elements not specifically depicted in FIG. 8A, can be configured to function as a memory device and be configured to communicate with the processor 21. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the Bluetooth® standard. In the case of a cellular telephone, the antenna 43 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that can be readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of display elements.

In some implementations, the driver controller 29, the array driver 22, and the display array 30 are appropriate for any of the types of displays described herein. For example, the driver controller 29 can be a conventional display controller or a bi-stable display controller (such as an IMOD display element controller). Additionally, the array driver 22 can be a conventional driver or a bi-stable display driver (such as an IMOD display element driver). Moreover, the display array 30 can be a conventional display array or a bi-stable display array (such as a display including an array of IMOD display elements). In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

If implemented in software, the functions may be stored on or transmitted over as one or more instructions or code on a computer-readable medium. The steps of a method or algorithm disclosed herein may be implemented in a processor-executable software module which may reside on a computer-readable medium. Computer-readable media includes both computer storage media and communication media including any medium that can be enabled to transfer a computer program from one place to another. A storage media may be any available media that may be accessed by a computer. By way of example, and not limitation, such computer-readable media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above also may be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of, e.g., an IMOD display element as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, a person having ordinary skill in the art will readily recognize that such operations need not be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A method of forming a thin film transistor (TFT) comprising:
   providing a substrate;
   exposing the substrate to a pulse of a first reactant to form an adsorbed layer of the first reactant over the substrate;
   exposing the substrate to a pulse of a second reactant to react with the first reactant; and
   exposing the substrate to a pulse of an oxidant to form a metal oxide layer, where the metal oxide layer is a tin-based (Sn-based) p-type semiconductor layer including a ternary compound Sn(II)—X—O that includes Sn—X bonds, wherein X is one of titanium (Ti), tungsten (W), boron (B), or niobium (Nb).

2. The method of claim 1, wherein the first reactant is an Sn(II)-based organometallic reactant.

3. The method of claim 1, wherein the substrate temperature is between about 50° C. and 300° C.

4. The method of claim 1, wherein the oxidant is selected from the group consisting of oxygen ($O_2$), ozone ($O_3$), water ($H_2O$), hydrogen peroxide ($H_2O_2$), carbon dioxide ($CO_2$), carbon monoxide (CO), methanol ($CH_3OH$), ethanol ($C_2H_6OH$), isopropyl alcohol ($C_3H_7OH$), and combinations thereof.

5. The method of claim 1, wherein the oxidant is a hydrogen-containing oxidant.

6. The method of claim 5, wherein hydrogen from the hydrogen-containing oxidant is incorporated in the metal oxide layer.

7. The method of claim 1, wherein the oxidant is a weak oxidant.

8. The method of claim 1, wherein exposing the substrate to a pulse of an oxidant includes applying energy to the pulse of the oxidant to form a plasma.

9. The method of claim 1, wherein the second reactant is selected from the group consisting of tungsten-containing reactants, titanium-containing reactants, niobium-containing reactants, and boron-containing reactants.

10. The method of claim 1, further comprising exposing the substrate to a dopant pulse.

11. The method of claim 10, wherein the dopant is hydrogen.

12. The method of claim 1, further comprising forming a gate electrode and a gate dielectric, wherein the gate dielectric is between the p-type semiconductor layer and the gate electrode.

13. The method of claim 12, wherein the gate electrode is formed over the metal oxide layer.

14. The method of claim 12, wherein the metal oxide layer is formed over the gate electrode.

15. The method of claim 1, wherein the exposing the substrate to a pulse of the second reactant forms an adsorbed layer of the second reactant on the substrate surface.

16. A method of forming a thin film transistor (TFT) comprising:
   providing a substrate;
   exposing the substrate to a pulse of a metal reactant to form an adsorbed layer of the metal reactant over the substrate;
   exposing the substrate to a pulse of an oxidant to react with the adsorbed layer of the metal reactant to form a metal oxide layer, wherein the metal oxide layer is a tin(II)-based p-type semiconductor layer having substantially no tin(IV); and
   incorporating a hydrogen content of at least $10^{20}$ atoms/$cm^3$ into the metal oxide layer, wherein incorporating a hydrogen content of at least $10^{20}$ atoms/$cm^3$ into the metal oxide layer includes exposing the substrate to a hydrogen-containing atmosphere during the metal reactant and oxidant pulses.

17. The method of claim 16, wherein the oxidant is a hydrogen-containing oxidant.

18. The method of claim 16, wherein incorporating a hydrogen content of at least $10^{20}$ atoms/$cm^3$ into the metal oxide layer includes exposing the substrate to dopant pulses to incorporate hydrogen into the metal oxide layer.

19. The method of claim 16, wherein incorporating a hydrogen content of at least $10^{20}$ atoms/$cm^3$ into the metal oxide layer includes annealing the metal oxide layer in a hydrogen atmosphere.

20. A method of forming a thin film transistor (TFT) comprising:
   providing a substrate;
   exposing the substrate to a pulse of a metal reactant to form an adsorbed layer of the metal reactant over the substrate;
   exposing the substrate to a pulse of an oxidant to react with the adsorbed layer of the metal reactant to form a metal oxide layer, wherein the metal oxide layer is a tin(II)-based p-type semiconductor layer having substantially no tin(IV); and
   incorporating a hydrogen content of at least $10^{20}$ atoms/$cm^3$ into the metal oxide layer, wherein the oxidant is a hydrogen-containing oxidant and incorporating a hydrogen content of at least $10^{20}$ atoms/$cm^3$ into the metal oxide layer includes applying energy to the pulse of the hydrogen-containing oxidant to form a plasma and incorporating hydrogen from the plasma into the metal oxide layer.

* * * * *